(12) United States Patent
Ushinaga et al.

(10) Patent No.: US 9,979,950 B2
(45) Date of Patent: May 22, 2018

(54) IMAGING DEVICE AND ELECTRONIC INFORMATION INSTRUMENT

(71) Applicant: Sharp Kabushiki Kaisha, Osaka (JP)

(72) Inventors: Takeo Ushinaga, Osaka (JP); Shinji Hattori, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 327 days.

(21) Appl. No.: 14/368,120

(22) PCT Filed: Nov. 22, 2012

(86) PCT No.: PCT/JP2012/007523
§ 371 (c)(1),
(2) Date: Jun. 23, 2014

(87) PCT Pub. No.: WO2013/094121
PCT Pub. Date: Jun. 27, 2013

(65) Prior Publication Data
US 2014/0368618 A1    Dec. 18, 2014

(30) Foreign Application Priority Data

Dec. 21, 2011    (JP) .................................. 2011-280346

(51) Int. Cl.
*H04N 13/02*    (2006.01)
*G03B 35/08*    (2006.01)
(Continued)

(52) U.S. Cl.
CPC ......... *H04N 13/0207* (2013.01); *G03B 35/08* (2013.01); *H01L 27/14607* (2013.01);
(Continued)

(58) Field of Classification Search
CPC .................................................. H04N 13/0207
See application file for complete search history.

(56) References Cited

U.S. PATENT DOCUMENTS 5,127,601 A * 7/1992 Schroeder .............. B64D 45/02
244/1 A
5,614,741 A * 3/1997 Harada ............. H01L 27/14806
257/222

(Continued)

FOREIGN PATENT DOCUMENTS

EP    0 069 938 A1    1/1983
JP    58-24105 A    2/1983
(Continued)

*Primary Examiner* — Tracy Y Li
(74) *Attorney, Agent, or Firm* — Keating & Bennett, LLP

(57) ABSTRACT

A means for correcting tilts and positional deviations from a stereo image is rendered unnecessary. The present invention has a solid-state imaging element 2 on which a plurality of light receiving sections for photoelectrically converting and imaging an image light from a subject are arranged in a matrix pattern and a lens means 3 with a single focal point on an imaging surface of the solid-state imaging element 2. The present invention is configured to simultaneously or chronologically expose and image each imaging light from a subject entering different positions of the lens means 3 as a plurality of images in a plurality of imaging regions for each predetermined imaging regions of the solid-state imaging element 2.

20 Claims, 17 Drawing Sheets

(51) Int. Cl.
*H01L 27/146* (2006.01)
*H04N 5/369* (2011.01)

(52) U.S. Cl.
CPC .. *H01L 27/14623* (2013.01); *H01L 27/14625* (2013.01); *H01L 27/14627* (2013.01); *H04N 13/0217* (2013.01); *H04N 5/3696* (2013.01)

(56) References Cited

U.S. PATENT DOCUMENTS

| | | | |
|---|---|---|---|
| 5,835,264 A | 11/1998 | Tandler et al. | |
| 6,204,967 B1* | 3/2001 | Morishima | G02B 27/2214 |
| | | | 348/54 |
| 6,781,632 B1 | 8/2004 | Ide | |
| 2005/0041135 A1* | 2/2005 | Togino | H04N 5/335 |
| | | | 348/340 |
| 2005/0078370 A1 | 4/2005 | Nishihara et al. | |
| 2007/0181923 A1* | 8/2007 | Tanaka | H01L 27/14627 |
| | | | 257/294 |
| 2008/0226170 A1* | 9/2008 | Sonoda | G06K 9/3233 |
| | | | 382/173 |
| 2010/0128152 A1 | 5/2010 | Hayasaka et al. | |
| 2011/0248371 A1* | 10/2011 | Matsumura | H01L 27/14612 |
| | | | 257/443 |
| 2011/0279727 A1 | 11/2011 | Kusaka | |
| 2012/0140100 A1* | 6/2012 | Shibazaki | H01L 27/14621 |
| | | | 348/281 |

FOREIGN PATENT DOCUMENTS

| | | |
|---|---|---|
| JP | 10-133307 A | 5/1998 |
| JP | 2000-305010 A | 11/2000 |
| JP | 2002-250860 A | 9/2002 |
| JP | 2003-523646 A | 8/2003 |
| JP | 2003-299121 A | 10/2003 |
| JP | 2009-150978 A | 7/2009 |
| JP | 2009-157198 A | 7/2009 |
| JP | 2010-147143 A | 7/2010 |
| JP | 2010-154493 A | 7/2010 |
| JP | 2010-169709 A | 8/2010 |
| WO | 00/50927 A2 | 8/2000 |

* cited by examiner (a)

(b)

(a)

(b)

(a)

(b)

(a)

(b)

IMAGING DEVICE AND ELECTRONIC INFORMATION INSTRUMENT

CROSS-REFERENCE TO RELATED APPLICATIONS

This application is a National Phase application filed under 35 USC 371 of PCT International Application No. PCT/JP2012/007523 with an International Filing Date of Nov. 22, 2012, which claims under 35 U.S.C. § 119(a) the benefit of Japanese Application No. 2011-280346, filed Dec. 21, 2011, the entire contents of which are incorporated herein by reference.

TECHNICAL FIELD

The present invention relates to a stereoscopic imaging device comprising a stereo imaging device that enables imaging of a plurality of images, such as stereoscopic stereo images, and electronic information instrument such as digital still cameras (digital cameras) such as a digital video camera, compact digital camera, mirrorless single-lens camera, and digital single-lens reflex camera, image input camera, scanner, facsimile device, camera-equipped mobile phone device, as well as smartphones, sensors of a self-propelling vacuum cleaner, and human detection sensors of an air conditioning unit using said imaging device in an imaging section as an image input device.

BACKGROUND ART

Conventional stereo imaging devices captured images by placing two cameras on the left and right as in human eyes, i.e., left and right images are captured by two cameras on the left and right to obtain left and right image data. The left and right image data is synthesized by every frame, every line or the like to obtain stereoscopic image data.

FIG. 16 is a schematic diagram showing an example of the configuration of essential parts of a conventional stereo imaging device.

In FIG. 16, a conventional stereo imaging device 100 is provided with two lens means 101 and 102 on the left and right, a solid-state imaging element 103 to which lights are collected by the lens means 101, and a solid-state imaging element 104 to which lights are collected by the lens means 102. A focal point is made in each imaging surface of the solid-state imaging elements 103 and 104 by the lens means 101 and 102 and image lights on the left and right are separately imaged by the solid-state imaging elements 103 and 104. The lens means 101 and 102 are expressed as single simplified convex lenses. Although a lens means may be a single convex lens, a lens means generally consists of a combination of a plurality of lenses.

For example, the Sharp smartphone SH-12C that went on sale in 2011, which is described in Non-Patent Literature 1, constitutes a stereo imaging device equipped with two independent cameras on the left and right. The smartphone is capable of expressing three-dimensionality by displaying stereo images that are simultaneously captured with the two independent cameras on the left and right on a parallax barrier 3D display.

In the aforementioned conventional stereo imaging devices, there is an issue of not being able to accurately fix the positional relationship of left and right images due to the two cameras being independent. If the positional relationship of left and right images cannot be accurately fixed, an accurate three-dimensional image cannot be obtained because the distance to a subject cannot be accurately obtained. In this regard, a means for correcting tilts and positional deviations from a stereo image has been proposed, for example, in Patent Literature 1. A correction is made by trimming so that a portion without parallax would be at the same position in left and right images.

Further, a means for stereo capturing with a single camera as in Patent Literature 2 has been proposed as a means that do not require such a correction. In Patent Literature 2, an imaging region is largely divided into two regions and pixels for receiving lights with different directionality from each other are disposed to obtain an image with different parallax.

Patent literature 2 is explained in further detail by using FIG. 17.

FIG. 17 is a cross-sectional view showing an example of a configuration of a conventional imaging section disclosed in Patent Literature 2 in detail.

In FIG. 17, a conventional imaging section 100 is utilized in a distance measuring device. An incident light L1 from a lens 101 is decomposed into two luminous fluxes L11 and L12 with an equal incident angle property by a beam splitter 102. The two luminous fluxes L11 and L12 are imaged with imaging elements 103R and 103L for right and left eyes, respectively.

In the imaging elements 103R and 103L, the direction of incident angle with the maximum sensitivity is set to a direction that deviates from a direction that is directly in front of an imaging surface, and the deviated directions are set in different directions. From the above setting, each of the imaging elements 103R and 103L is set to have directivity with a characteristic of deviating from the direction that is directly in front of an imaging surface to form different directivity properties. The imaging section 100 outputs imaging results by the imaging elements 103R and 103L as imaging signals SR and SL for right and left eyes.

From the above, an incident light from an optical system is separated into two luminous fluxes with equal incident angle characteristic, and each luminous flux is then imaged by the imaging elements 103R and 103L for right and left eyes, respectively, to obtain imaging results for right and left eyes having parallax. Thus, to that extent, the configuration of an optical system is simplified in addition to having a reduced size in comparison to a case of generating two luminous fluxes having parallax with an optical system.

The imaging elements 103R and 103L for right and left eyes are, for example, CCD solid-state imaging elements. The imaging elements are made by forming photosensors 105 in a matrix pattern and a register for sequentially transferring and outputting electrical charges accumulated by the photosensors 105 on a semiconductor substrate 104 and forming a color filter and on-chip microlens 106 on a surface. The imaging elements 103R and 103L are set so that a direction of an incidence angle with a maximum sensitivity is a direction deviated from a direction that is directly in front of an imaging surface with the setting of an incident pupil by the on-chip microlens 106.

Specifically, the imaging element 103R for a right eye is made so that the on-chip microlens 106 is deviated by only a predetermined interval TR in a transverse direction with respect to the photosensor 105. Further, the imaging element 103L for a left eye is made so that the on-chip microlens 106 is deviated by only a predetermined interval TR in the opposite direction from that for the imaging element 103R with respect to the photosensor 105.

From the above, the imaging elements 103R and 103L for right and left eyes selectively allow entry and receive a light from an incoming direction related to right and left eyes from two luminous fluxes L11 and L12 that are separated by the beam splitter 102 to output image results for right and left eyes having parallax, respectively.

CITATION LIST

Patent Literature

Patent Literature 1: Japanese Patent No. 4225768
Patent Literature 2: Japanese Laid-Open Publication No. 2006-165601

Non Patent Literature

Non Patent Literature 1: SH-12C Product Catalog http://www.sharp.co.jp/products/sh12c/index.html

SUMMARY OF INVENTION

Technical Problem

Since two cameras on the left and right are independent in the above-described conventional stereo imaging devices disclosed in Patent Literature 1 and Non Patent Literature 1, it is not possible to accurately fix the cameras when fixing the two cameras on the left and right. Thus, a means for correcting tilts and positional deviations from a stereo image is needed. Unless an image is captured while two cameras are aligned horizontally, an effective stereo image cannot be obtained.

In the above-described conventional stereo imaging device 100 disclosed in Patent Literature 2, an incident light is divided with the beam splitter 102 to distribute the incident light to the imaging elements 103R and 103L for right and left eyes provided at positions with directivity. When the beam splitter 102 and the two imaging elements 103R and 103L for right and left eyes cannot be accurately fixed, a means for correcting tilts and positional deviations from a stereo image is needed.

The present invention solves the above-described conventional issue. The purpose of the present invention is to provide an imaging device that can render a means for correcting tilts and positional deviations from a three-dimensional image, such as a stereo image, unnecessary, and electronic information instrument such as a camera-equipped mobile phone device that uses said imaging device in an imaging section as an image input device.

Solution to Problem

An imaging device having a lens means with a single focal point on an imaging surface according to the present invention is provided, where the imaging device is configured to have a solid-state imaging element on which a plurality of pixels are arranged in a matrix pattern in the imaging surface, have a light shielding layer provided with a single aperture section and a plurality of light receiving regions for separating and receiving diagonal lights that have passed the aperture section in respectively different directions on the pixels, separate a light from a subject which has entered the imaging surface into a plurality of lights with different directivity, and photoelectrically convert the light for each of the pixels, and simultaneously image the light as a plurality of images, thereby achieving the objective described above.

Preferably, in the imaging device according to the present invention, a plurality of separated image lights are imaged in the plurality of light receiving regions provided for each of the pixels of the solid-state imaging element.

Still preferably, in the imaging device according to the present invention, lights are received by the solid-state imaging element as a right image that has entered the right side of the lens means and a left image that has entered the left side of the lens means for stereo imaging.

Still preferably, in the imaging device according to the present invention, a light shielding member is provided in a belt shape at a center section of the lens means in a longitudinal direction in a plan-view, and the lens means is divided into a right-side region and a left-side region by the light shielding member.

Still preferably, in the imaging device according to the present invention, a light shielding member is provided in an upper edge region and a bottom edge region of the lens means in a plan-view, and a light passing region of the lens means is a transverse central region that is narrowed from top and bottom edges.

Still preferably, in the solid-state imaging element in the imaging device according to the present invention, the pixels are provided with a light shielding layer, the light shielding layer is provided with a single aperture section, and the pixels are provided with a plurality of light receiving regions for receiving diagonal lights that have passed the aperture section of the light shielding layer.

Still preferably, in the imaging device according to the present invention, a color filter with a predetermined color arrangement is provided for each of the pixels above the light shielding layer in the pixels in the solid-state imaging device.

Still preferably, in the imaging device according to the present invention, a reflection preventing film is provided above the light shielding layer or a color filter in the pixels in the solid-state imaging element.

Still preferably, in the imaging device according to the present invention, the plurality of light receiving regions for each of the pixels in the solid-state imaging element are constituted of two left and right or top and bottom imaging regions for receiving a diagonal light that has passed an aperture section in a longitudinal or transverse direction.

Still preferably, in the imaging device according to the present invention, the aperture section in a longitudinal or transverse direction for each of the pixels in the solid-state imaging element is a slit-shaped or rectangular-shaped aperture section that is long in the longitudinal or transverse direction, and two left and right or top and bottom imaging regions are provided in a direction with directivity in the longitudinal or transverse direction through the aperture section.

Still preferably, in the imaging device according to the present invention, the solid-state imaging device is provided with a plurality of light receiving regions around the aperture section of the light shielding layer in a plan-view for each of the pixels.

Still preferably, in the imaging device according to the present invention, a shape of the aperture section of the light shielding layer is a cross shape in a plan-view, and the solid-state imaging element is provided with four light receiving regions in four quadrangles, whose sides are ½ of each of longitudinal and transverse sides for each of the pixels, wherein the cross shape divides the light receiving regions in four.

Still preferably, in the imaging device according to the present invention, a shape of the aperture section of the light shielding layer is formed in a quadrangular shape in a center in a plan-view, wherein the solid-state imaging element is provided with four light receiving regions in four quadrangles that are adjacent to each corner section formed by two adjacent longitudinal and transverse sides of the quadrangular shape in the center for each of the pixels, wherein the two adjacent sides are parallel to the sides of the four light receiving regions.

Still preferably, in the imaging device according to the present invention, a shape of the aperture section of the light shielding layer is formed in a polygonal shape in a center in a plan-view, and the solid-state imaging element is provided with trapezoidal light receiving regions in a same number as a number of all sides of the aperture section of the polygonal shape in the center for each of the pixels, such that top sides are parallel and adjacent to all sides of the aperture section with the polygonal shape in the center and an area expands further away from the central polygonal shape.

Still preferably, in the imaging device according to the present invention, the shape of the aperture section of the light shielding layer is a quadrangular shape in the center in a plan-view, and the solid-state imaging element is provided with four light receiving regions in four trapezoidal shapes for each of the pixels, such that each topside is parallel to four sides of the quadrangular shape in the center and the area expands further away from the quadrangular shape.

Still preferably, in the imaging device according to the present invention, the shape of the aperture section of the light shielding layer is an octagonal shape in the center in a plan-view, and the solid-state imaging element is provided with eight light receiving regions in eight trapezoids for each of the pixels, such that each top side is parallel to eight sides of the octagonal shape in the center and the area expands further away from the octagonal shape.

Still preferably, in the imaging device according to the present invention, a shape of the aperture section of the light shielding layer is a circular shape in a center in a plan-view, and the solid-state imaging element is provided with the plurality of light receiving regions in a plurality of fan shapes for each of the pixels, such that a width expands further away from the circular shape around the circular shape of the center.

Still preferably, in the imaging device according to the present invention, the plurality of light receiving regions for each of the pixels are provided on the left and right in a plan-view, and the plurality of light receiving regions have a stereo image structure in which a light receiving region for a right image with directivity in a right diagonal direction and a light receiving region for a left image with directivity in a left diagonal direction form a pair.

Still preferably, in the imaging device according to the present invention, the plurality of light receiving regions of each of the pixels are constituted of four light receiving regions disposed in a 2×2 array shape, wherein the plurality of light receiving regions are configured to separate and receive lights with respectively different directivity.

Still preferably, in the imaging device according to the present invention, the plurality of light receiving regions for each of the pixels are disposed and divided in a cross shape or an X shape and constituted of four light receiving regions that are disposed in top and bottom directions and left and right directions or diagonal directions from top right to bottom left and from top left to bottom right, wherein the plurality of light receiving regions are configured to separate and receive lights with respectively different directivity.

Still preferably, in the imaging device according to the present invention, the plurality of light receiving regions are constituted of each of the light receiving regions that are disposed and separated radially into a plurality of light receiving regions from the aperture section of the light shielding layer in a center section in a plan-view, wherein the plurality of light receiving regions are configured to separate and receive lights with respectively different directivity.

Still preferably, in the imaging device according to the present invention, a single central light receiving region is further provided below a position corresponding to the aperture section in a center of the light shielding layer for each of the pixels.

Still preferably, in the imaging device according to the present invention, a single central light receiving region is further provided at a position below the aperture section of the light shielding layer, wherein the single light receiving region receives a light without directivity from the aperture section.

Still preferably, in the imaging device according to the present invention, the plurality of light receiving regions for each of the pixels are constituted of nine light receiving regions disposed in a 3×3 array shape, wherein the plurality of light receiving regions have a light receiving region in the center for receiving a light without directivity and eight surrounding light receiving regions for separating and receiving lights with respectively different directivity, the eight surrounding light receiving regions being disposed around the light receiving region in the center.

Still preferably, in the imaging device according to the present invention, the imaging device has a central light receiving region corresponding to the aperture section in the center of the light shielding layer and four surrounding light receiving regions disposed adjacent to top and bottom positions and left and right positions of the central light receiving region, wherein the imaging device is configured to receive a light without directivity by the central light receiving region and separate and receive lights with respectively different directivity by the four surrounding light receiving regions.

Still preferably, in the imaging device according to the present invention, an outer shape of the light shielding layer and a shape of the aperture section in the center of the light shielding layer are both quadrangular and each corner section of the quadrangle of the aperture section is disposed while opposing each side of the outer shape of the light shielding layer, and four light receiving regions are configured as four triangular shapes constituting four corner regions of a quadrangle and bottom sides oppose each side of the aperture section in the center in a plan-view, wherein a light receiving region in the center is provided below a position corresponding to the aperture section in the center, wherein the light receiving region in the center is configured to receive lights without directivity and the four light receiving regions positioned around the light receiving region in the center are configured to separate and receive lights with respectively different directivity.

Still preferably, in the imaging device according to the present invention, the central light receiving region is identical to or different from a plurality of surrounding light receiving region in terms of area.

Still preferably, in the imaging device according to the present invention, the central light receiving region is configured to be larger or smaller in terms of area in comparison to each of the plurality of surrounding light receiving regions.

Electronic information equipment using an imaging device according to the present invention in an imaging section as an image input device is provided, thereby achieving the objective described above.

The functions of the present invention having the structures described above will be described hereinafter.

The present invention has a solid-state imaging element on which a plurality of light receiving sections for photoelectric conversion and imaging of an image light from a subject are arranged in a matrix pattern and a lens means having a focal point on an imaging surface of the solid-state imaging element. In addition, the present invention is configured to image each image light from a subject which has entered different positions of the lens means as a plurality of images in a plurality of imaging regions of each predetermined imaging region of the solid-state imaging element.

Thereby, each image light from a subject which has entered different positions of a lens means is imaged as a plurality of images in a plurality of regions of a solid-state imaging element. Thus, it is possible to render a means for correcting tilts and positional deviations from a three-dimensional image, such as a stereo image, unnecessary.

Advantageous Effects of Invention

According to the present invention as described above, each image light from a subject which has entered different positions of a lens means is imaged as a plurality of images in a plurality of regions of a solid-state imaging element. Thus, it is possible to render a means for correcting tilts and positional deviations from a three-dimensional image such as a stereo image unnecessary.

Figure 1:
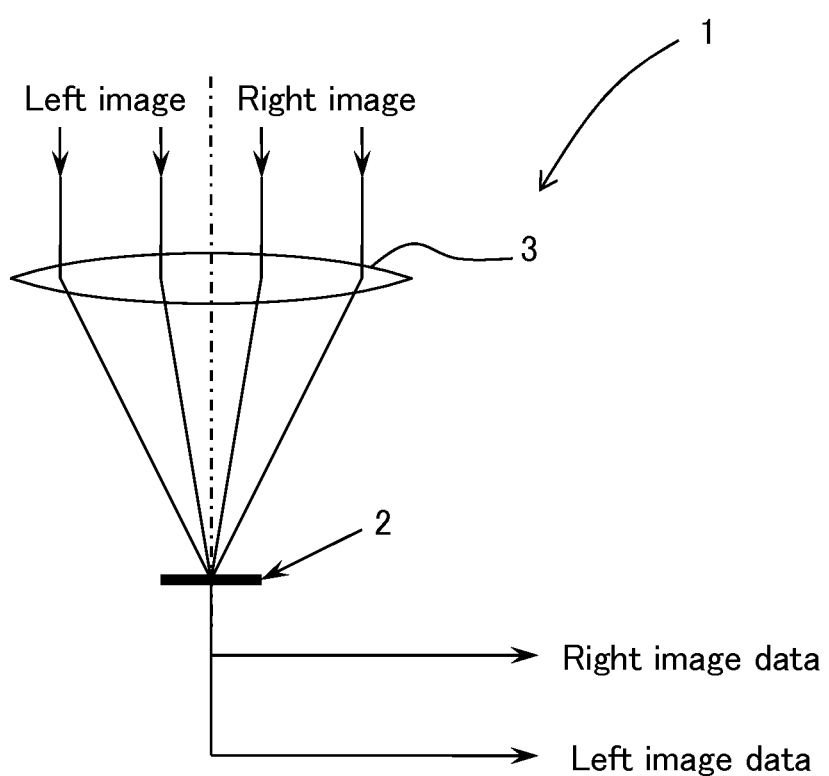
FIG. 1 is a diagram of the configuration of essential parts of an optical system imaging structure in an imaging device of Embodiment 1 of the present invention.

REFERENCE SIGNS LIST 1, 11-16, 16A-16D, 17-19 Imaging device
2 solid-state imaging element
2$a$, 21$a$ photodiode for right image
2$b$, 21$b$ photodiode for left image
22, 23, 26-30 photodiode
29$a$, 30$a$ central photodiode
3, 31, 32 lens means
311, 321 right-side lens region
312, 322 left-side lens region
4, 41 light shielding layer
4$a$, 41$a$ aperture section
42 belt-shaped light shielding plate
43$a$, 43$b$ belt-shaped light shielding plate
44-50 light shielding layer
44$a$-50$a$ aperture section
5 color filter
6 reflection preventing film
90 electronic information instrument
91 memory section
92 display section
93 communication section
94 image outputting section
C vertical center line

DESCRIPTION OF EMBODIMENTS

Hereinafter, an optical system imaging structure will be explained as Embodiment 1 of a stereoscopic imaging device including a stereo imaging device of the present invention. In addition, a pixel imaging structure of a solid-state imaging element, which is an imaging section, will explained as Embodiments 2-4 of a stereoscopic imaging device including a stereo imaging device of the present invention. Further, Embodiment 5 for an electronic information instrument such as a camera-equipped mobile phone device using any one of Embodiments 1-4 for a stereoscopic imaging device including these stereo imaging devices in an imaging section as an image input device will be explained in detail with reference to the drawings. In addition, from the standpoint of creating the Figures, the thickness and length of each constituent member or the like in each Figure is not limited to the illustrated configuration.

Embodiment 1

FIG. 1 is a diagram of a configuration of essential parts of an optical system imaging structure in an imaging device of Embodiment 1 of the present invention.

In FIG. 1, an imaging device 1 of the present Embodiment 1 has a solid-state imaging element 2 on which a plurality of pixels for photoelectric conversion and imaging of an image light from a subject are arranged in a matrix pattern and a lens means 3 having a single focal point on an imaging surface of the solid-state imaging element 2, and the imaging device 1 is configured to simultaneously or chronologically expose and image each image light as a plurality of images from a subject which has entered different positions of the lens means 3 in a plurality of light receiving regions of each pixel of the solid-state imaging element 2. After a plurality of image data from the solid-state imaging element 2, e.g., two image data on the left and right, are synthesized with a signal synthesizing means for each frame, for each line, for each multiple lines or the like, predetermined signal processing (AD conversion, white balance, color interpolation, gamma correction and the like) is applied to the data with a signal processing means and the data is converted to a stereoscopic image data of a color image.

The lens means 3 consisting of a convex lens for collecting lights has a single focal point on an imaging surface of the solid-state imaging element 2. A lens system combining a plurality of lenses may be used as long as an image can be formed on an imaging surface as in a common camera. By taking advantage of the fact that a light of a right image that has entered the right side of the lens means 3 and a light of a left image that has entered the left side of the lens means 3 enter the solid-state imaging element 2 from separate directions of left and right, images are separated into a right-side region and a left-side region, whereby it is possible to obtain right image data and left image data corresponding to a right-side light receiving region and a left-side light receiving region provided for each pixel of the solid-state element 2.

Stereo imaging of a right image that has entered the right side of the lens means 3 and a left image that has entered the left side is possible in the right-side light receiving region and the left-side light receiving region provided for each pixel of the solid-state imaging element 2. In this case, imaging is not performed with a plurality of solid-state imaging elements as in the conventional art. Instead, it is possible to obtain a stereo image from at least two images consisting of a right image and left image at once with a single solid-state imaging element 2. Thus, a means from correcting tilts and positional deviation of an image from a stereo image, which was conventionally necessary, can be rendered unnecessary.

The above explains a case in which each of left and right image lights from a subject, which have entered different positions of a single leans means 3, e.g., two regions on the left and right, are simultaneously imaged in light receiving regions in each pixel of the solid-state imaging element 2, e.g., left and right light receiving regions. However, a case in which a portion of a single lens means 3 is shielded from lights to eliminating a light with low directivity in addition to the above is explained by using FIGS. 2 and 3.

Figure 2:
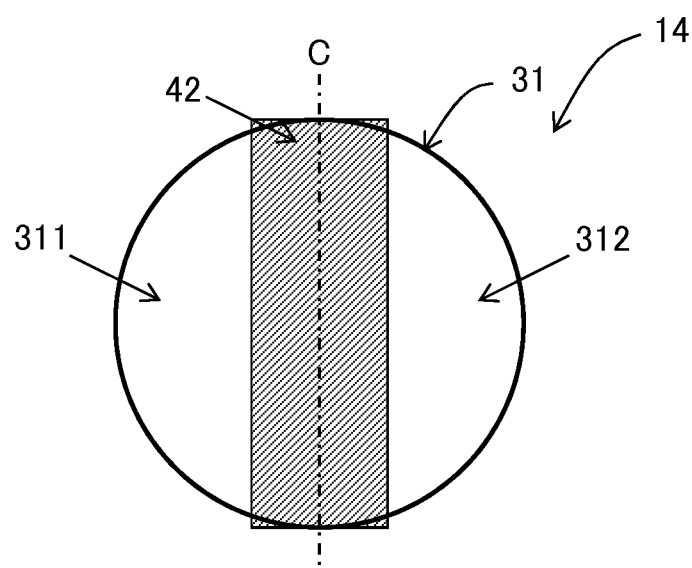
FIG. 2 is a plan-view showing a modified example of a lens means in the imaging device of Embodiment 1 of the present invention.

FIG. 2 is a front view showing a modified example of a lens means in the imaging device of Embodiment 1 of the present invention.

In FIG. 2, an imaging device 14 in a modified example of the present Embodiment 1 is provided with a light shielding plate 42 as a light shielding member in a belt shape in the center section of a lens means 31 in the longitudinal direction in a plan-view. The lens means 31 is divided by the light shielding plate 42 into left and right, a right-side lens region 311 and a left-side lens region 312. In sum, the light shielding plate 42 is provided as a light shielding member in a belt-shape with a predetermined width along a vertical center line C in the up-down direction (longitudinal direction) of the lens means 31, and the lens means 31 is divided by the light shielding plate 42 into left and right lens regions, right-side lens region 311 and left-side lens region 312. A light shielded by the belt-shaped light shielding plate 42 in the center is unnecessary because such a light lacks directivity and parallax.

The belt-shaped light shielding plate 42 for shielding lights is provided in the center section when viewed from the front of the lens means 31. Left and right images of the lens means 31 are imaged in separate imaging regions. In other words, a light is received as a right image that has entered the right side of the lens means 31 and a left image that has entered the left side of the lens means 31 and are imaged in two imaging regions on the left and right sides of the solid-state imaging element 2.

That is, in the imaging device 14 of the modified example of the present Embodiment 1, each of left and right incident lights from the right-side lens region 311 and the left-side lens region 312 of the lens means 31, which are separated by the light shielding plate 42, separates in a diagonal direction and enters a plurality of photodiodes provided in each of the two imaging regions on the left and right of a single solid-state imaging element 2 via a color filter with a predetermined color arrangement for each pixel. Each of the lights is received and photoelectrically converted in the plurality of photodiodes provided in each of the two imaging regions on the left and right. Furthermore, a reflection preventing film may be provided above the color filter in the imaging device 14 of the present Embodiment 1. In this case, a reflection of incident lights diagonally from left and right is inhibited by the reflection preventing film to enhance light utilization efficiency.

Next, a modified example, that is different from the case of FIG. 2 when a part of a single lens means 3 is shielded, will be explained by using FIG. 3.

Figure 3:
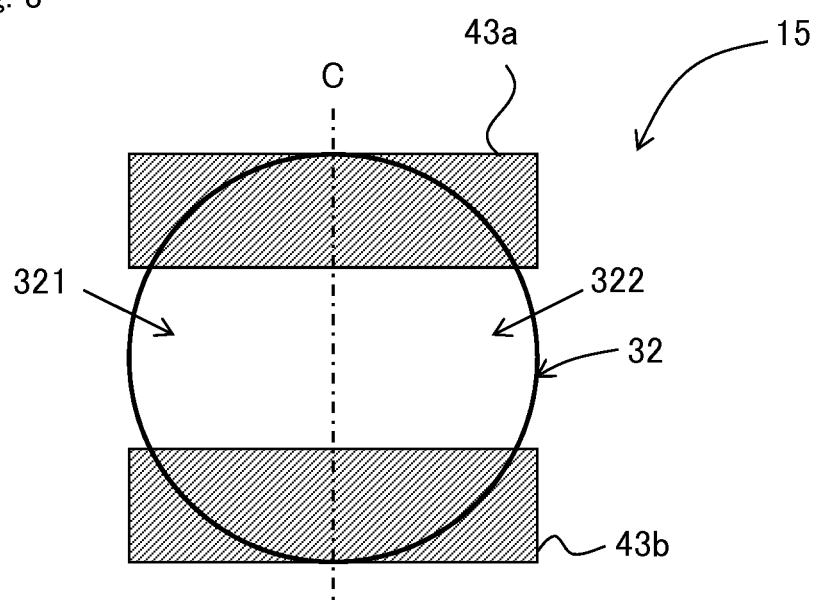
FIG. 3 is a plan-view showing another modified example of the lens means in the imaging device of Embodiment 1 of the present invention.

FIG. 3 is a plan-view showing another modified example of the lens means in the imaging device of Embodiment 1 of the present invention.

In FIG. 3, an imaging device 15, which is another modified example of the present Embodiment 1, is provided with belt-shaped light shielding plates 43a and 43b as light shielding members in the top edge and bottom edge regions of a lens means 32 in a plan-view. An aperture section of the lens means 32 is the central region in the transverse direction, which is narrowed from the top and bottom. In sum, each of the light shielding plates 43a and 43b with a rectangular shape in the transverse direction that is orthogonal to the vertical central line C in the up-down direction is provided so that the top or bottom of the top edge section and bottom edge section of the lens means 32 is covered. An aperture region of the lens means 32 is narrowed from the top and bottom by light shielding plates 42a and 42b.

In this manner, the light shielding plates 43a and 43b with a rectangular shape in the transverse direction are provided at the top and bottom edges when viewed from the front of the lens means 32. The left and right images of the lens means 32 whose aperture section is narrowed in the top and bottom can be captured separately. That is, a light is received as a right image that has entered the right side of the lens means 32 and a left image that has entered the left side of the lens means 32 and imaged in two imaging regions on the left and right of the solid-state imaging element 2. Since parallax of incident lights to a location that is far to the left or right of the lens means 32 is large, images on the left and right can be more readily separated when the aperture section of the lens means 32 is long transversely to the left and right. In this case, a portion shielded from light is unnecessary. Thus, it is possible to cut this portion out to make it smaller.

That is, in the imaging device 15 of another modified example of the present Embodiment 1, left and right incident lights from a right side lens region 321 and a left-side lens region 322 of the lens means 32, whose top and bottom edges are shielded from light by the light shielding plates 43a and 43b, separate in a diagonal direction and enter a plurality of photodiodes provided in each of the two imaging regions on the left and right of a single solid-state imaging element 2 via a color filter with a predetermined color arrangement for each pixel. Each of the lights is received and photoelectrically converted in the plurality of photodiodes provided in each of the two imaging regions on the left and right. Furthermore, a reflection preventing film may be provided above the color filter in the imaging device 15 of the present Embodiment 1. In this case, a reflection of diagonal incident lights, diagonally left and right, is inhibited by the reflection preventing film to enhance light utilization efficiency.

From the above, according to the present Embodiment 1, the imaging device 1 can be materialized with a camera that is structurally one camera (one solid-state imaging element 2), and a conventional means for correcting tilts and position deviations from a plurality of images, such as stereo images, is rendered unnecessary. Although it would be difficult to significantly separate the left and right because left and right cameras are materialized with a single lens means 3, the left and right can be readily brought closer to handle capture with a lens close to a subject, which was not possible with conventional techniques. Further, in terms of costs, a plurality of cameras can be aggregated into a single camera to enable great reduction in costs.

Thus, each image light from a subject that has entered different positions of the lens means 3 is imaged in a plurality of regions of the solid-state imaging element 2 as a plurality of images. Thus, there is no deterioration in the resolution as in the conventional art, and a means for correcting tilts and positional deviations from a three-dimensional image, including a stereo image, can be rendered unnecessary.

Further, since a portion of a single lens means 3 with little light directivity is shielded from light, separation of left and right images is facilitated to allow a means for correcting tilts and positional deviations from a stereo image to be rendered unnecessary.

The present Embodiment 1 explained a case in which it is possible to perform three-dimensional capturing including stereo capturing with a single leans means 3 and a single solid-state imaging element 2 as an optical system imaging structure of an imaging device. However, the configuration is not limited thereto. A pixel imaging structure of an imaging device may be configured to have a single aperture section and a plurality of photodiodes for each pixel to receive lights with different directivity. A pixel imaging structure of an imaging device will be explained in detail in the following Embodiments 2-4.

In sum, as the optical system imaging structure of the present Embodiment 1, a plurality of light receiving regions for each predetermined imaging region of the solid-state imaging element 2 may be a plurality of light receiving regions for the entire imaging region of the solid-state imaging element 2. In this case, an aperture section for separating lights with directivity in a light shielding layer is provided for the entire imaging region of a single solid-state imaging element 2. In addition, a plurality of light receiving regions for receiving each light with directivity may be provided for the aperture section, but there may not be an aperture section for separating lights with directivity in a light shielding layer.

As a pixel imaging structure, for a plurality of light receiving regions for each predetermined imaging region of the solid-state imaging element 2, a plurality of light receiving regions may be provided in each light receiving section (each pixel) of a plurality of light receiving sections (plurality of pixels) provided on the solid-state imaging element 2. In this case, an aperture section for separating lights with directivity is provided in a light shielding layer for each light receiving section (each pixel) of the plurality of light receiving sections (plurality of pixels) on a single solid-state imaging element 2. In addition, a plurality of light receiving regions for receiving each light with directivity are provided for each aperture.

As an intermediate concept of these optical system imaging structures and pixel imaging structures, it is possible to provide a plurality of predetermined imaging regions divided from the entire imaging region of the solid-state imaging element 2 and to provide a plurality of light receiving regions for each predetermined imaging region. In this case, it is possible to provide an aperture section for separating lights with directivity in a light shielding layer to each predetermined imaging region of a single solid-state imaging element 2 and to provide a plurality of light receiving regions for receiving each light with directivity for each aperture. In each of a plurality of predetermined imaging regions, a plurality of light receiving sections (plurality of pixels) for photoelectric conversion and imaging of an image light from a subject are arranged in a matrix pattern.

Example 2

An optical system imaging structure was explained in the above-described Embodiment 1. However, the present Embodiment 2 will explain a case in which an aperture section for separating lights with directivity is provided in a light shielding layer and a plurality of light receiving regions are provided in positions therebelow for each light receiving section (each pixel) as a pixel imaging structure.

Figure 4:
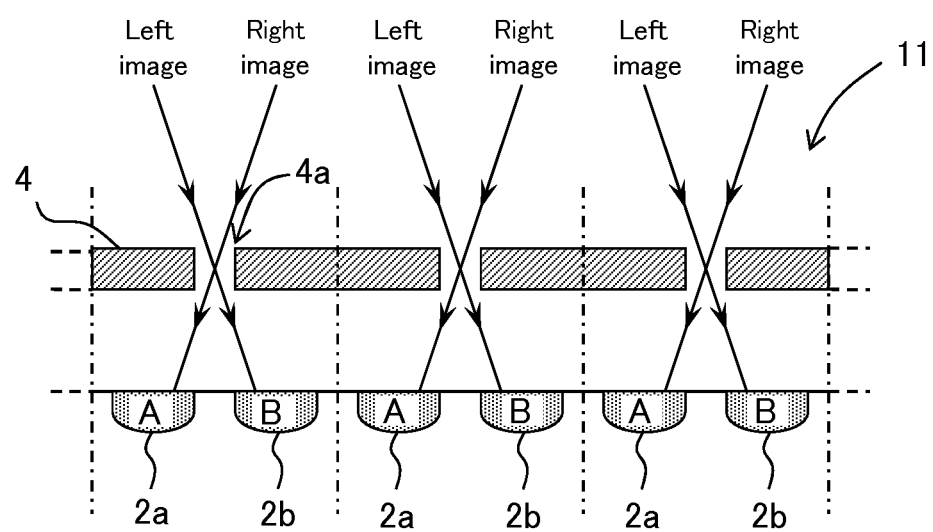
FIG. 4($a$) is a cross-sectional view of a pixel section of a solid-state imaging element as a specific example in the imaging device of Embodiment 2 of the present invention, and (b) is a plan-view of the solid-state imaging device of (a).
Figure 4:
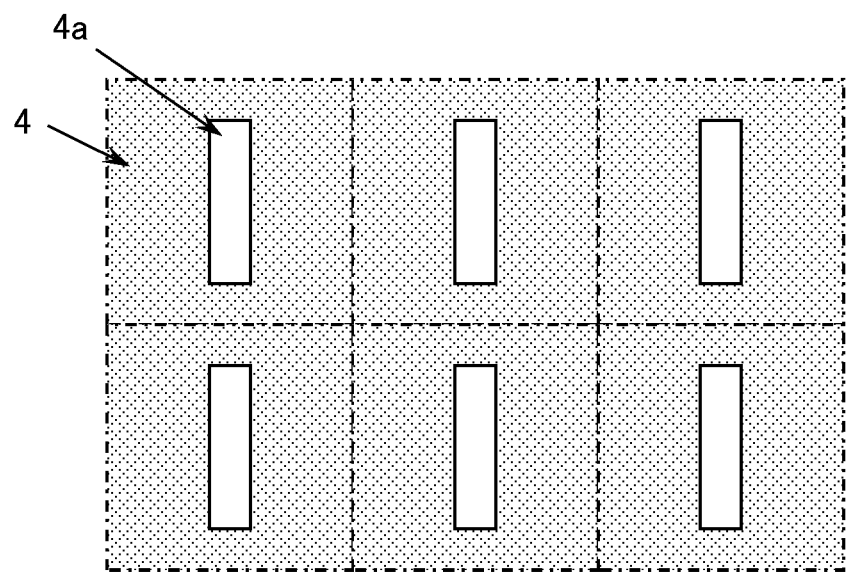

FIG. 4(*a*) is a cross-sectional view of a solid-state imaging element 2 and a wiring layer as a specific example in an imaging device 11 of Embodiment 2 of the present invention, and FIG. 4(*b*) is a plan-view of the wiring layer of FIG. 4(*a*). Although FIG. 4(*b*) shows six pixels, in actuality, numerous pixels are arranged in a matrix pattern. This can be used in a case of a black and white image without a color filter placed thereon or in a case of a color image with a color filter placed thereon.

As shown in FIGS. 4(*a*) and 4(*b*), in the imaging device 11 of the present Embodiment 2, a light shielding layer 4 is provided either between a solid-state imaging element 2 and lens means 3, that is not shown, or above the solid-state imaging element 2. An aperture section 4*a* for separating lights with directivity is provided for each light receiving section (each pixel) in the light shielding layer 4 (wiring layer). In the solid-state imaging element 2, a plurality of light receiving regions A and B for receiving diagonal lights with directivity which have passed the aperture section 4*a* of the light shielding layer 4 are provided for each light receiving section (each pixel).

If explained in more detail, the plurality of light receiving regions for each pixel are constituted here of two light receiving regions A and B on the left and right, which are separated in the transverse direction (transverse direction orthogonal to longitudinal direction), for receiving diagonal lights with directivity that have passed the aperture section 4*a* that is shaped as a slit or the like in a longitudinal direction. The solid-state imaging element 2 is provided on the surface layer of a semiconductor substrate. The solid-state imagining element 2 comprises an arrangement of a plurality of pixels, such as stereo pixels, e.g., the two light receiving regions A and B on the left and right for each pixel. A single stereo pixel is constituted of a pair of a photodiode 2*a* for right images and a photodiode 2*b* for left images as the two light receiving regions A and B on the left and right. The photodiodes 2*a* and 2*b* on the left and right have conductivity as well as a light shielding property by using a metallic material such as an aluminum material in the light shielding layer (wiring layer) 4. However, the rectangular-shaped or slit-shaped aperture 4*a* which is long longitudinally is provided in the light shielding layer 4 above and between the left and right photodiodes 2*a* and 2*b*. Thus, diagonal lights of incident lights separate and reach the locations of the left and right photodiodes 2*a* and 2*b* in a diagonal direction with directivity via the aperture section 4*a*. In other words, an incident light of a right image which enters diagonally from the right direction enters the photodiode 2*a* for right images and an incident light of a left image which enters diagonally from the left direction enters the photodiode 2*b* for left images. In this manner, it is possible to simultaneously image the left and right images by a single stereo pixel. Thus, a plurality of stereo pixels can be arranged in a matrix pattern to simultaneously image a stereo image with one solid-state imaging element 2.

In this regard, the configuration of the present Embodiment 2 and prior art are compared.

Figure 5:
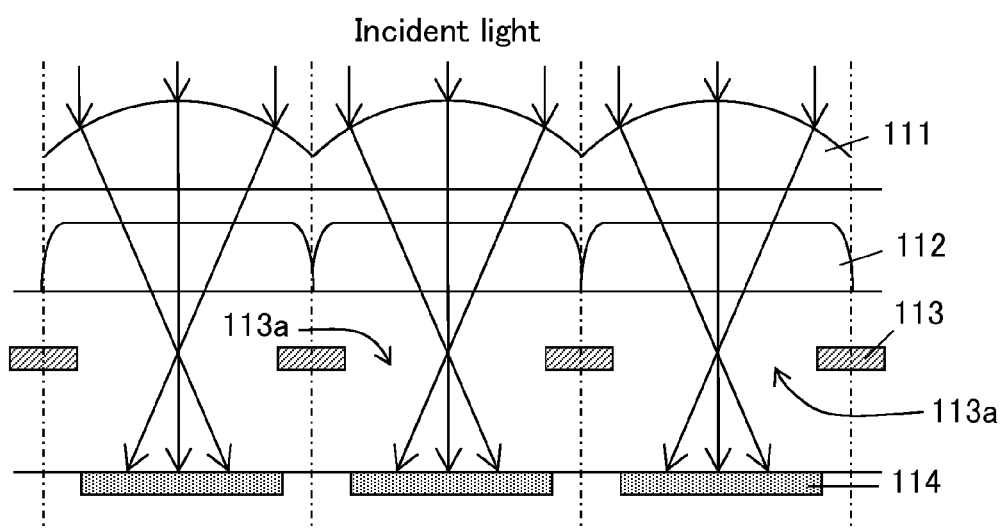
FIG. 5($a$) is a cross-sectional view of a pixel section comprising a microlens, a color filter, and a solid-state imaging element in a conventional stereo imaging device, and (b) is a plan-view of the solid-state imaging element of (a).
Figure 5:
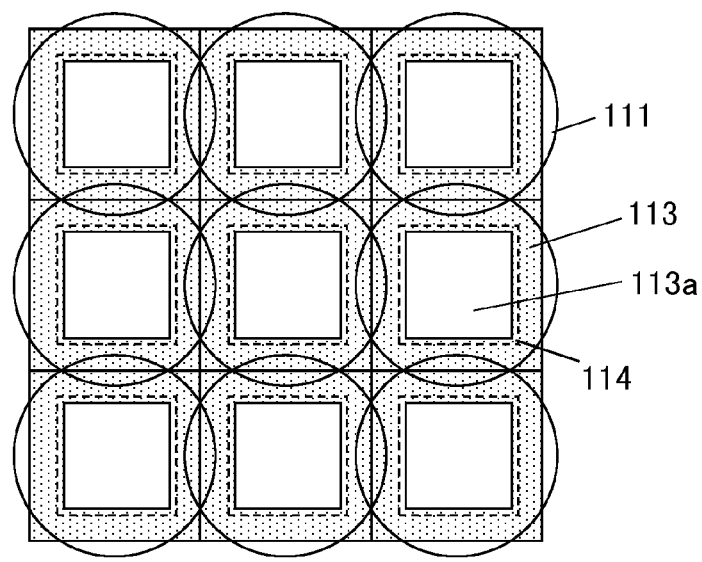

FIG. 5(*a*) is a cross-sectional view of a pixel section comprising a microlens, a color filter, a wiring layer, and a solid-state imaging element in a conventional imaging device, and FIG. 5(*b*) is a plan-view schematically showing the positional relationship of the microlens, color filter, wiring layer, and solid-state imaging element of FIG. 5(*a*).

In the prior art of FIGS. 5(*a*) and 5(*b*), incident lights are collected via a microlens 111 for each pixel. After passing through each color filter 112 with a predetermined color arrangement (e.g., Bayer arrangement), an incident light of each color enters a photodiode 114 via an aperture section 113*a* of a wiring layer 113 for each pixel and is photoelectrically converted. Two sets thereof for right and left images are needed for a stereoscopic view.

The structural difference of the prior art in FIGS. 5(*a*) and 5(*b*) and the present Embodiment 2 in FIGS. 4(*a*) and 4(*b*) is that, in the present Embodiment 2, incident lights are focused through the slit-shaped aperture section 4*a* and separated diagonally for a right image and left image to the left and right photodiodes 21*a* and 21*b* to enable three-dimensional imaging with a single solid-state imaging element 2. The aperture section 113*a* of the wiring layer 113 of prior art is opened to a size matching the light receiving size of the photodiode 114, whereas the aperture section 4*a* of the light shielding layer 4 (wiring layer) in the present Embodiment 2 is opened in an oblong slit shape or a rectangular shape to separate lights with directivity to left and right. In this manner, the present Embodiment 2 is constituted of a single solid-state imaging element 2 that is separated for a right image and a left image. Thus, a means for correcting tilts and positional deviations from a plurality of images such as stereo images, which was a means conventionally needed, can be rendered unnecessary.

A specific example of the imaging device 11 of the present Embodiment 2 will be further explained.

Figure 6:
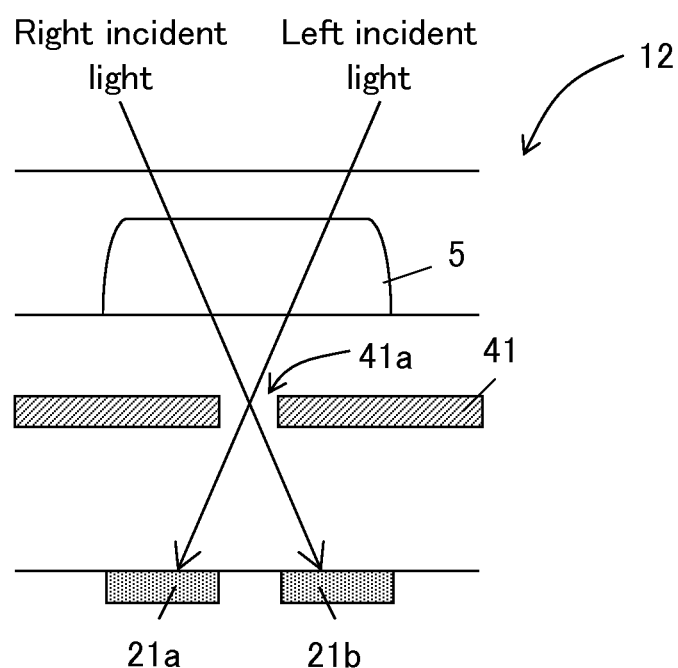
FIG. 6($a$) is a cross-sectional view of a pixel section comprising a color filter, a wiring layer, and a solid-state imaging element in the imaging device of Embodiment 2 of the present invention, and (b) is a plan-view of the solid-state imaging element of (a).
Figure 6:
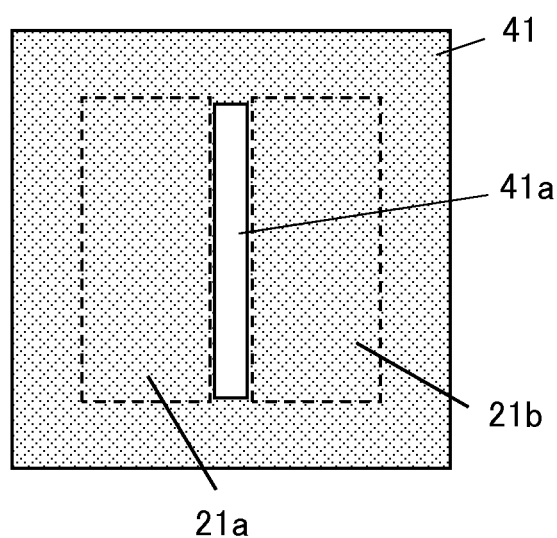

FIG. 6(*a*) is a cross-sectional view of a pixel section comprising a color filter, a wiring layer, and a solid-state imaging element in the imaging device of Embodiment 2 of the present invention, and FIG. 6(*b*) is a plan-view of the wiring layer and the solid-state imaging element of FIG. 6(*a*).

As shown in FIGS. 6(*a*) and 6(*b*), in an imaging device 12 of the present Embodiment 2, incident lights including diagonal left and right lights from a lens means 3 separate in diagonal directions and enter each of left and right photodiodes 21*a* and 21*b* for each pixel from an oblong slit-shaped aperture section 41*a* of a light shielding layer (wiring layer) 41 through a color filter 5 with a predetermined color arrangement for each pixel, and each light is received for each pixel with the left or right photodiodes 21*a* and 21*b* for photoelectric conversion. The left and right photodiodes 21*a* and 21*b* for each pixel are arranged in the left and right positions below the oblong slit-shaped or rectangular-shaped aperture section 41*a* in the longitudinal direction in a plan-view. Thereby, a diagonal light from the top right to the bottom left (left incident light) enters the photodiode 21*a* through the aperture section 41*a* of the light shielding layer 41. Further, a diagonal light from the top left and the bottom right (right incident light) enters the photodiode 21*b* through the aperture section 41*a* of the light shielding layer 41.

Figure 7:
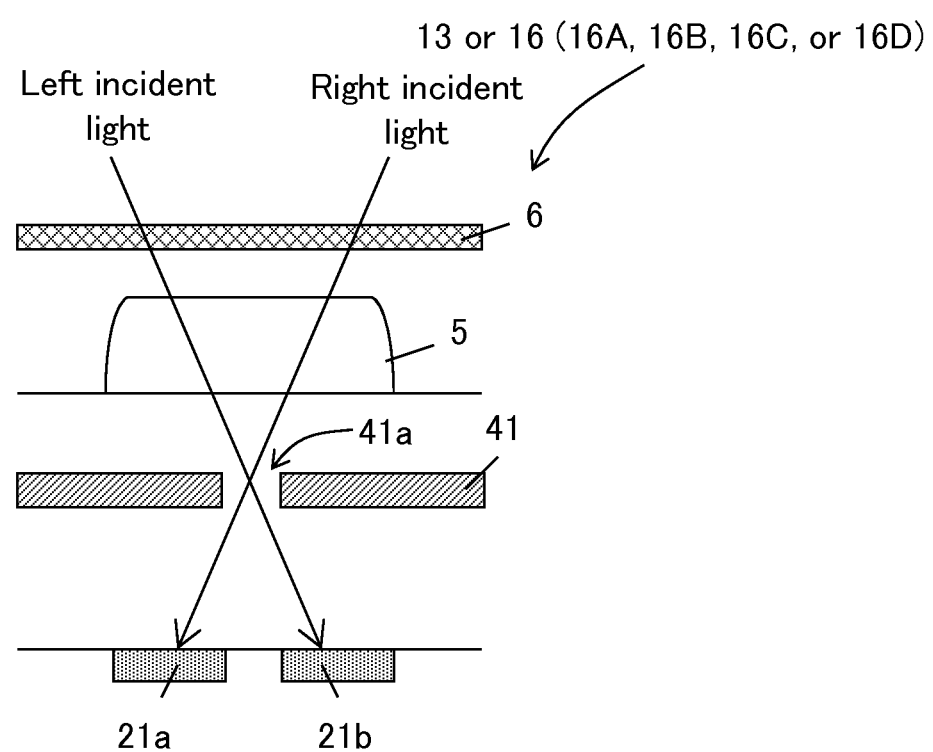
FIG. 7 is a cross-sectional view of the imaging device of FIG. 6($a$) when added with a reflection preventing film above the color filter.

FIG. 7 is a cross-sectional view of the imaging device of FIG. 6(*a*) when added with a reflection preventing film above the color filter.

In FIG. 7, in an imaging device 13 of the present Embodiment 2, a reflection preventing film 6 is provided above the color filter 5 to inhibit reflection of diagonal incident lights from the left and right. Incident lights from diagonally left and right are efficiently absorbed without reflection with the reflection preventing film 6, and each light separates diagonally and enter the left and right photodiodes 21*a* and 21*b* for each pixel from the oblong slit-shaped or rectangular-shaped aperture section 41*a* of the light shielding layer (wiring layer) 41 through a color filter with a predetermined color arrangement for each pixel. The left and right photodiodes 21*a* and 21*b* receives each light for each pixel for photoelectric conversion. Here, the efficiency of incident lights entering from diagonal left and right directions is improved by providing the reflection preventing film 6 above the color filter 5. The left and right photodiodes 21*a* and 21*b* are disposed in positions for selecting diagonal lights from the left and right.

From the above, according to the present Embodiment 2, an aperture section for separating lights with directivity are provided on a light shielding layer and a plurality of light receiving regions are provided for each light receiving section (each pixel) as a pixel imaging structure. Thus, one of imaging devices 11-13 can be materialized with a camera that is structurally one camera (single solid-state imaging element 2) and a means for correcting tilts and positional deviations from a plurality of images, such as stereo images, as in the past is rendered unnecessary. Although it would be difficult to significantly separate the left and right, the left and right can be readily brought closer together to handle image capture with a lens close to a subject, which was not possible with conventional technique. Further, in terms of costs, a plurality of cameras can be aggregated into a single camera to enable great reduction in costs.

Embodiment 3

As a pixel imaging structure, the above-described Embodiment 2 explained a case of simultaneously imaging each of image lights from the left and right from a subject, which has entered different positions of a single lens means 3, or two regions of the left and right, in predetermined imaging regions of the solid-state imaging element 2, e.g., left and right light receiving regions for each light receiving section (each pixel). However, in the present Embodiment 3, as a pixel imaging structure, in addition to the content of the above-described Embodiment 1, although a human being views a three-dimensional image with parallax in the left and right directions, a three-dimensional image may be obtained with parallax in up and down directions, or in left and right directions and up and down directions. Furthermore, an excellent three-dimensional image can be obtained by a plurality of directivity including diagonal directions. From such a standpoint, the relationship of the shape of an aperture section of a wiring layer and the shape of a plurality of light receiving regions therebelow will be explained.

In an imaging device 16 of the present Embodiment 3, a light shielding layer 4 is provided between a lens means 3 and a solid-state imaging element 2 (e.g., photodiode as each light receiving section). An aperture section 4*a* for separating lights with directivity is provided for each light receiving section in the light shielding layer 4. In the solid-state imaging element 2, a plurality of light receiving regions for receiving a diagonal light with directivity that has passed the aperture section 4*a* of the light shielding layer 4 are provided. Furthermore, a color filter 5 with a predetermined color arrangement for each light receiving section is provided between the lens means 3 and the light shielding layer 4. In addition, a reflection preventing film 6 is provided between the lens means 3 and the color filter 5. A matching microlens can of course be provided above the color filter 5 for each pixel.

In sum, the imaging device 16 of the present Embodiment 3 is provided with two or more photodiodes as a plurality of light receiving regions and a corresponding readout circuit for each light receiving section (each pixel), and comprises the light shielding layer 4 having a single aperture section 4*a* above the two or more photodiodes for each pixel. In addition, the imaging device 16 is configured to separate diagonal lights from the aperture section 4*a* in respectively different directions and allow the two or more photodiodes to receive the lights.

The relationship between the shape of an aperture section of a light shielding plate and the shape of a light receiving region therebelow will be explained hereinafter.

Figure 8:
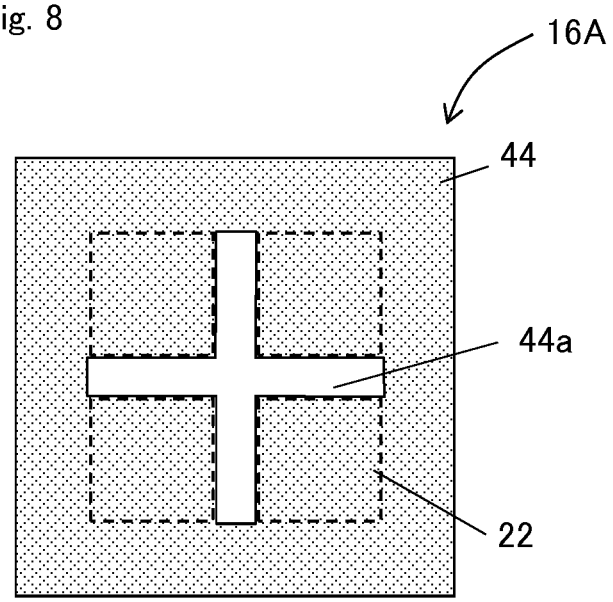
FIG. 8 is a plan-view showing one example of the relationship between the shape of an aperture section of a light shielding layer and the shape of a light receiving region therebelow of a pixel section of a solid-state imaging element in the imaging device of Embodiment 3 of the present invention.

FIG. 8 is a plan-view showing one example of the relationship between the shape of an aperture section of a light shielding layer and the shape of a light receiving region therebelow in the imaging device 16 of Embodiment 3 of the present invention. This is a case in which a three-dimensional image is obtained by parallax in four diagonal directions of top right to bottom left, bottom right to top left, top left to bottom right, and bottom left to top right, aside from the left and right directions and up and down directions.

As shown in FIG. 8, a light shielding layer 44 is provided between the lens means 3 and a solid-state imaging element 2 (e.g., photodiode as each light receiving section) in an imaging device 16A of the present Embodiment 3. An aperture section 44*a* is provided for each light receiving section in the light shielding layer 44, and the shape of the single aperture section 44*a* is a cross shape for each light receiving section. The solid-state imaging element 2 is provided with four photodiodes 22 as four light receiving regions for receiving diagonal lights that have passed the cross-shaped aperture section 44*a* of the light shielding layer 44. Furthermore, a color filter 5 with a predetermined color arrangement is provided for each light receiving section between the lens means 3 and the light shielding layer 44. A reflection preventing film 6 is provided between the lens means 3 and the color filter 5.

In the solid-state imaging element 2, the four photodiodes 22 are provided for the cross-shaped aperture section 44*a* of the light shielding layer 44 as four quadrangular shapes, whose sides are ½ of each of longitudinal and transverse sides of the cross shape (when the cross is regarded as not having any line width), for each light receiving section while being separated in a cross shape of the aperture section 44*a*. That is, the shape of the aperture section 44*a* of the light shielding layer 44 is a cross shape in a plan-view. In addition, the solid-state imaging element 2 is provided with four photodiodes 22 as four light receiving regions in four quadrangular shapes divided into a cross shape by the aperture section 44*a* with a cross shape for each light receiving section. The four photodiodes 22 are disposed in positions for selecting a diagonal light in each of the four directions of top left to bottom right, bottom left to top right, bottom right to top left, and top right to bottom left.

Figure 9:
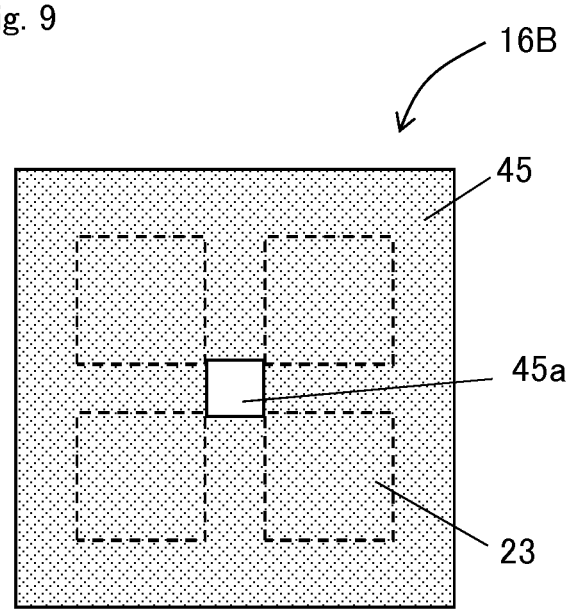
FIG. 9 is a plan-view showing another example of the relationship between the shape of an aperture section of a light shielding layer and the shape of a light receiving region therebelow of a pixel section of a solid-state imaging element in the imaging device of Embodiment 3 of the present invention.

FIG. 9 is a plan-view showing another example of the relationship between the shape of an aperture section of a light shielding plate and the shape of a light receiving region therebelow of the imaging device 16 of Embodiment 3 of the present invention. This is a case in which a three-dimensional image is obtained by parallax of two diagonal directions from top right to bottom left and top left to bottom right and two diagonal directions from bottom right to top left and bottom left to top right.

As shown in FIG. 9, an imaging device 16B of the present Embodiment 3 is provided with a light shielding layer 45 between a lens means 3 and a solid-state imaging element 2 (e.g., photodiodes as each light receiving section) and an aperture section 45*a* for separating lights with directivity is provided for each light receiving section in the light shielding layer 45. The shape of the single aperture section 45*a* is a quadrangle (square or rectangle; herein a square) in the center section for each light receiving section. The solid-state imaging element 2 is provided with four photodiodes 23 that are quadrangular in a plan-view as four light receiving regions for receiving diagonal lights with directivity that have passed the square aperture section 45a in the center of the light shielding layer 45. Furthermore, a color filter 5 with a predetermined color arrangement for each light receiving section is provided between a lens means 3 and the light shielding layer 45. In addition, a reflection preventing film 6 is provided between the lens means 3 and the color filter 5.

The solid-state imaging element 2 is provided with four quadrangular photodiodes 23 for each light receiving section so that a corner section formed by lines parallel to two adjacent sides of the center square of the aperture section 45a contacts a corner section of the square aperture section 45a in the center of the light shielding layer 45, where the two adjacent sides are parallel to the sides of the four quadrangular photodiodes. That is, the shape of the aperture section 45a of the light shielding layer 45 is a quadrangular shape in the center in a plan-view. The solid-state imaging element 2 is provided with photodiodes 23 as four light receiving regions in four quadrangular shapes that are adjacent to a corner section formed by two adjacent longitudinal and transverse sides of the quadrangular shape in the center, where the two adjacent sides are parallel to the sides of the four light receiving regions. The four photodiodes 23 are disposed in locations for selecting a diagonal light in each of the four directions of top left to bottom right, bottom left to top right, bottom right to top left, and top right to bottom left.

As shown in FIGS. 8 and 9, the plurality of photodiodes 22 or 23 as a plurality of light receiving regions of each pixel section are disposed and divided in a cross shape (the following FIG. 10) or an X shape (FIGS. 8 and 9) in a plan-view. The photodiodes are constituted of four light receiving regions disposed in the up and down directions and left and right directions, or diagonal direction from top right to bottom left and diagonal direction from to top left to bottom right. In addition, the photodiodes are constituted to separate and receive lights with respectively different directivity. Further, if explained from another viewpoint, the plurality of photodiodes 22 or 23 as a plurality of light receiving regions for each pixel are constituted of four light receiving regions disposed in a 2×2 array pattern. In addition, the photodiodes are constituted to separate and receive lights with respectively different directivity. In this manner, it is possible to simultaneously capture an image with four directivities by disposing four photodiodes 22 or 23 in a 2×2 array pattern for each pixel. Although stereo capturing is not possible unless two photodiodes on the left and right have angles that are aligned horizontally in the above-described Embodiments 1 and 2, stereo capturing becomes possible thereby even when the solid-state imaging element 2 is rotated. Further, complementing a plurality of image data leads to enhancement in the precision of a stereo image.

Figure 10:
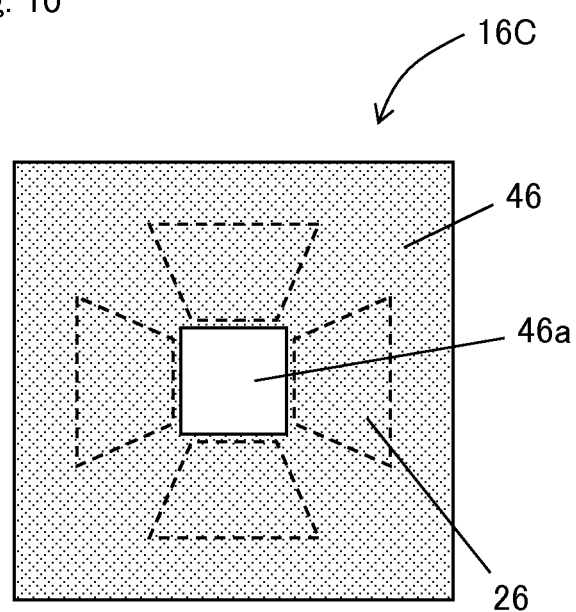
FIG. 10 is a plan-view showing another example of the relationship between the shape of an aperture section of a light shielding layer and the shape of a light receiving region therebelow of a pixel section of a solid-state imaging element in the imaging device of Embodiment 3 of the present invention.

FIG. 10 is a plan-view showing another example of the relationship between the shape of an aperture section of a light shielding plate and the shape of a light receiving region therebelow of the imaging device 16 of Embodiment 3 of the present invention. This is a case in which a three-dimensional image is obtained by parallax in four directions, left and right directions and up and down directions.

As shown in FIG. 10, an imaging device 16C of the present Embodiment 3 is provided with a light shielding layer 46 between a lens means 3 and a solid-state imaging element 2 (e.g., photodiode as each light receiving section), and an aperture section 46a is provided for each light receiving section in the light shielding layer 46. The shape of the single aperture section 46a is a polygonal quadrangle (square or rectangle, a square herein) in the center section for each light receiving section. The solid-state imaging element 2 is provided with four photodiodes 26 that are quadrangular in a plan-view as four light receiving regions in left, right, top, and bottom for receiving diagonal lights that have passed the square aperture section 46a in the center of the light shielding layer 46. Furthermore, a color filter 5 with a predetermined color arrangement is provided for each light receiving section between a lens means 3 and the light shielding layer 46. In addition, a reflection preventing film 6 is provided between the lens means 3 and the color filter 5.

The solid-state imaging element 2 is provided with four trapezoidal photodiodes 26 for each light receiving section such that top sides are parallel and adjacent to four sides of the center square of the aperture 46a and the width and area expand further away from the central square shape with respect to the square aperture section 46a in the center of the light shielding layer 46. That is, the shape of the aperture section 46a of the light shielding layer 46 is a quadrangular shape in the center in a plan-view, and the solid-state imaging element 2 is provided with photodiodes 26 as four light receiving regions in four trapezoidal shapes for each light receiving section such that top sides are parallel to four sides of the center quadrangular shape and the width and area expand further away from the central quadrangular shape. The four photodiodes 26 are disposed in locations for selecting a diagonal light in each of the four directions of left to right, right to left, top to bottom and bottom to top.

Figure 11:
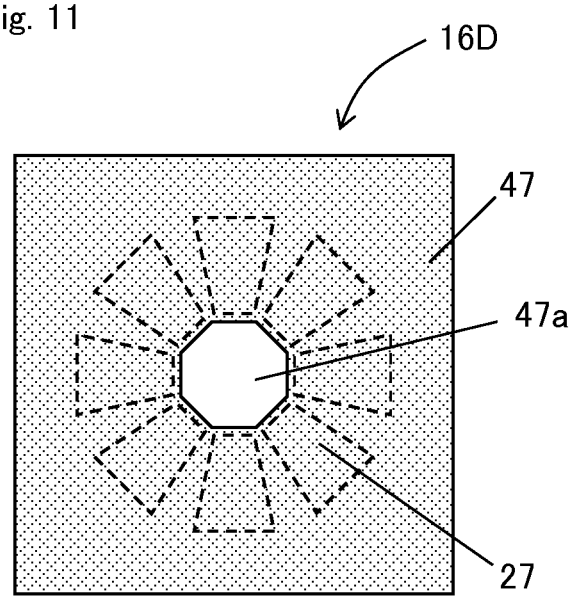
FIG. 11 is a plan-view showing yet another example of the relationship between the shape of an aperture section of a light shielding layer and the shape of a light receiving region therebelow of a pixel section of a solid-state imaging element in the imaging device of Embodiment 3 of the present invention.

FIG. 11 is a plan-view showing yet another example of the relationship between the shape of an aperture section of a light shielding plate and the shape of a light receiving region therebelow in the imaging device 16 of Embodiment 3 of the present invention. This is a case in which a three-dimensional image is obtained by parallax of a total of 8 directions, i.e., diagonal direction from bottom right to top left, diagonal direction from bottom left to top right, diagonal direction from top right to bottom left, and diagonal direction from top left to bottom right in addition to four directions in the left and right directions and up and down directions.

As shown in FIG. 11, an imaging device 16D of the present Embodiment 3 is provided with a light shielding layer 47 between a lens means 3 and a solid-state imaging element 2 (e.g., photodiode as each light receiving section), and an aperture section 47a for separating lights with directivity is provided on the light shielding layer 47 for each light receiving section. The shape of the single aperture section 47a is formed in a polygonal octagon in the center for each light receiving section. In the solid-state imaging element 2, eight photodiodes 27 are radially provided for each light receiving section as eight light receiving regions for receiving diagonal lights with directivity that have passed the octagonal aperture section 47a of the light shielding layer 47 in the center of a pixel. Furthermore, a color filter 5 with a predetermined color arrangement is provided for each light receiving section between a lens means 3 and the light shielding layer 46. In addition, a reflection preventing film 6 is provided between the lens means 3 and the color filter 5.

The solid-state imaging element 2 is provided with eight trapezoidal photodiodes 27 for each light receiving section such that the top sides are parallel to eight sides of the octagonal shape of the aperture 47a in the center and the width and area expand further away from the central octagonal shape with respect to the octagonal aperture section 47a in the center of the light shielding layer 47. That is, the shape of the aperture section 47a of the light shielding layer 47 is an octagonal shape in the center of a pixel in a plan-view, and the solid-state imaging element 2 is provided with eight trapezoidal photodiodes 27 for each light receiving section as eight light receiving regions in eight trapezoidal shapes such that the top sides are parallel and adjacent to the eight sides of the octagonal aperture 47a in the center and the width and area expands further away from the octagonal shape. The eight radial trapezoidal shapes are positioned outside of the eight sides of the trapezoidal aperture sections 47a in the center in a plan-view. The eight trapezoidal photodiodes 26 are disposed in positions for selecting a diagonal light in each of the total of eight directions, i.e., four directions from top left to bottom right, bottom left to top right, bottom right to top left, and top right to bottom left, and four directions in the left and right directions and up and down directions.

In sum, the shape of an aperture of a light shielding layer is a polygonal shape in the center in a plan-view, and the solid-state imaging element 2 is provided with eight trapezoidal light receiving regions for each light receiving section in the same number as the number of all sides, such that the top sides are parallel and adjacent to all sides of the polygonal shape in the center and the width and area expand further away from the central polygonal shape. In this case, the photodiodes 26 and 27 as the plurality of light receiving regions for each pixel are constituted of each light receiving region that is separated into a plurality of light receiving regions and disposed radially from the aperture sections 46a and 47a of the light shielding layers 46 and 47 in pixel center sections in a plan-view. In addition, the photodiodes are constituted to separate and receive lights with respectively different directivity.

In this manner, a solid-state imaging element is constituted of four photodiodes 26 that are disposed and divided into a cross shape for each pixel as shown in FIG. 10. Further, a solid-state imaging element is constituted of four photodiodes 22 and 23 that are disposed and divided into an X shape for each pixel as shown in FIGS. 8 and 9. In addition, a solid-state imaging element is constituted by photodiodes 27 that are radially disposed and divided into a plurality of smaller light receiving regions for each pixel as shown in FIG. 11. Thus, a plurality of images with directivity can be simultaneously captured and an excellent three-dimensional image can be obtained by multiple parallaxes.

From the above, accordingly to the present Embodiment 3, the shape of an aperture section of a light shielding layer is formed in a cross shape or a polygonal shape in the center in a plan-view, and a plurality of light receiving regions are formed to surround the cross shape or polygonal shape for each light receiving section on the solid-state imaging element 2 under the aperture. Hence, a fine stereoscopic view is made possible by synthesizing data images for a plurality of light receiving regions. Thus, there is no deterioration in resolution as in the prior art. In addition, a means for correcting tilts and positional deviations from a plurality of images such as stereo images can be rendered unnecessary, and a stereoscopic image with abnormalities can be inhibited. In this manner, it is possible to enhance the precision of a plurality of images such as stereo images by complementing with a plurality of images.

Furthermore, a plurality of photodiodes for each pixel are disposed in a 2×2 array pattern or radially from the center of a pixel by dividing into a plurality of light receiving regions to obtain a plurality of images with different directivity to enable stereo capture even when the solid-state imaging element 2 is rotated.

The present Embodiment 3 explained a case in which the shape of an aperture section of a light shielding layer is formed in a cross shape or a polygonal shape in the center in a plan-view and a plurality of light receiving regions are formed to surround the cross shape or the polygonal shape for each light receiving section on the solid-state imaging element 2 under the aperture. However, the configuration is not limited thereto. The configuration may be such that the shape of an aperture section of a light shielding layer is formed in a circular shape in the center in a plan-view and a plurality of light receiving regions (e.g., a plurality of trapezoidal or fan-shaped light receiving regions) are formed to surround the circular shape for each light receiving section on the solid-state imaging element 2 under the aperture. For example, a plurality of light receiving regions in a plurality of fan shapes with a width that widens further away from the circular shape can be provided for each pixel in around the circular shape in the center.

The present Embodiment 3 explained a case in which a plurality of light receiving regions have a plurality of directivities for each light receiving section around an aperture section of a light shielding layer above the solid-state imaging element 2. However, the configuration is not limited thereto. It is possible to have a structure of a stereo pixel in which a plurality of light receiving regions are provided on the left and right in a plan-view for each pixel and a light receiving region for right image with directivity in the right diagonal direction and a light receiving region for left image with directivity in the left diagonal direction form a pair. In sum, the solid-state imaging element 2 can be an array of stereo pixels in which a right circuit with directivity in the right diagonal direction and a left circuit with directivity in the left diagonal direction form a pair. In this manner, a stereo pixel comprises a single window (aperture section), and a light beam is distributed to a photodiode for a right image or a photodiode for a left image depending on the angle of incident light entering the aperture section.

Embodiment 4

The above-described Embodiment 2 explained a case of simultaneously imaging each of left and right imaging lights from a subject that has entered different positions of a single lens means 3, e.g., two regions on the left and right, in at least imaging regions on the left and right with a solid-state imaging element 2 as a pixel imaging structure. However, in the present Embodiment 4, as a pixel imaging structure, in addition to the content of the above-described Embodiment 1, although a human being views a three-dimensional image with parallax in the left and right directions, a three-dimensional image can be obtained with parallax in the up and down directions, or in left and right directions and up and down directions. Furthermore, a clear three-dimensional image can be obtained by lights with directivity from an aperture section including diagonal directions and lights without directivity from the aperture section. From such a standpoint, the relationship between the shape of an aperture section of a wiring layer and the shape of a light receiving region therebelow will be explained.

Figure 12:
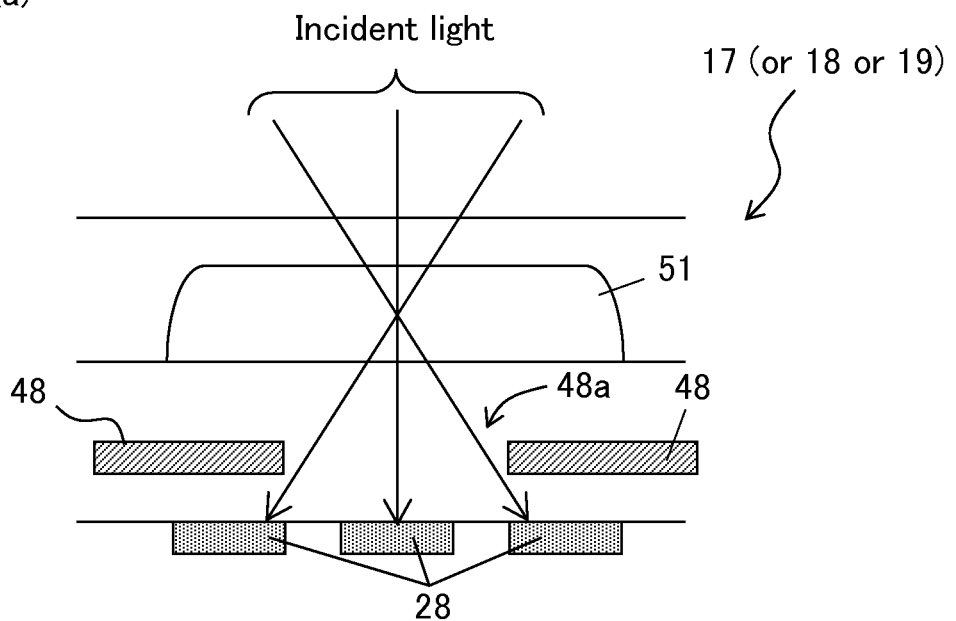
FIG. 12($a$) is a cross-sectional view of a pixel section comprising a color filter, light shielding layer and a solid-state imaging element in an imaging device of Embodiment 4 of the present invention, and (b) is a plan-view of the light shielding layer and solid-state imaging element of (a).
Figure 12:
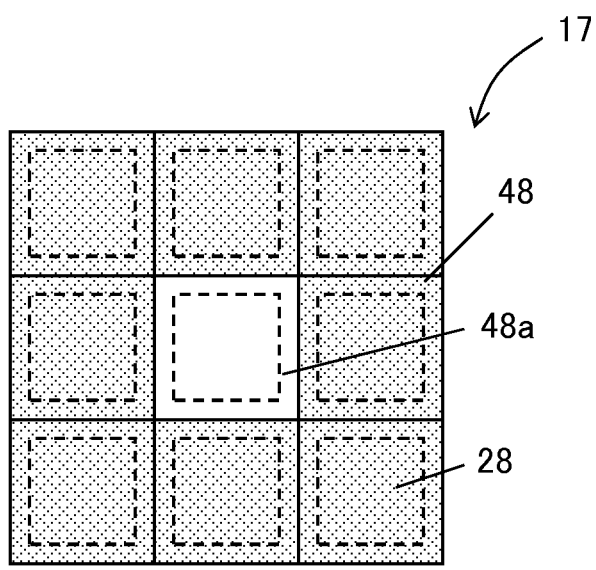

FIG. 12(*a*) is a cross-sectional view of a pixel section comprising a color filter, a wiring layer and a solid-state imaging element in an imaging device of Embodiment 4 of the present invention, and FIG. 12(*b*) is a plan-view of the wiring layer and solid-state imaging element of FIG. 12(*a*).

As in FIGS. 12(*a*) and 12(*b*), an imaging device 17 of the present Embodiment 4 is provided with a light shielding layer (wiring layer) 48 between a lens means 3 that is not shown and a photodiode 28 constituting a solid-state imaging element 2. An aperture section 48a for separating lights with directivity is provided in the center section of each light receiving section in the light shielding layer 48. Eight photodiodes 28 around the aperture section 48a, as a plurality of light receiving regions for receiving diagonal lights having directivity that have passed the aperture section 48a of the light shielding layer 48 and a single photodiode 28 in the center for receiving rectilinear lights without directivity that have passed the aperture section 48a at a corresponding position below (position directly below) the aperture section 48a, are provided in the solid-state imaging element 2. A color filter 5 with a predetermined color arrangement is provided for each light receiving section between a lens means 3 and the light shielding layer 48. A reflection preventing film 6 may or may not be provided between the lens means 3 and the color filter 5. Here, a color display is explained, but the configuration is not limited thereto. In a black and white display, the color filter 5 is not present. In either a color display or a black and white display, it is possible that the reflection preventing film 6 is not provided.

In sum, the imaging device 17 of the present Embodiment 4 is provided with two or more photodiodes 28 as a plurality of light receiving regions (each pixel) and readout circuits corresponding thereto for each light receiving section. The imaging device comprises the light shielding layer 48 with the single aperture section 48a above two or more photodiodes 28 for each pixel. The imaging device is configured so that diagonal lights with directivity from the aperture section 48a in the center section are separated in eight respectively different directions and received at each of the surrounding two or more (herein, 8) photodiodes 28, and rectilinear lights without directivity from the aperture section 48a in the center section are received by the single central photodiode 28.

That is, the nine photodiodes 28 as a plurality of light receiving regions are disposed in a matrix of a 3×3 array pattern in the longitudinal and transverse directions of the same size, including the single photodiode 28 positioned in the center below the aperture section 48a for receiving lights without directivity and the surrounding eight photodiodes 28, which are disposed around the center photodiode 28 in eight directions of top, bottom, left, right, and diagonal directions and separate and receive lights with respectively different directivity.

Figure 13:
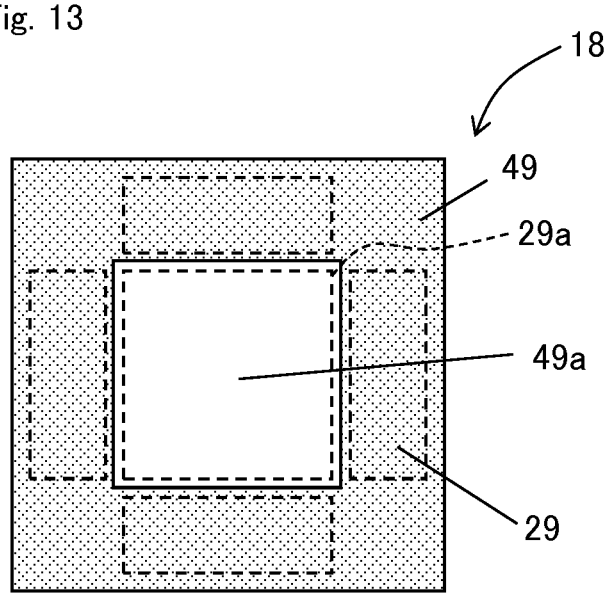
FIG. 13 is a plan-view showing an example of the relationship between the shape of an aperture section of a light shielding layer and the shape of a light receiving region therebelow of a pixel section of a solid-state imaging element in the imaging device of Embodiment 4 of the present invention.

FIG. 13 is a plan-view an example of the relationship between the shape of an aperture section of a light shielding plate and the shape of a light receiving region therebelow in an imaging device 18 of Embodiment 4 of the present invention.

As shown in FIG. 13, the imaging device 18 of the present Embodiment 4 has a photodiode 29a as a light receiving region in the center in a plan-view corresponding to a quadrangular (square or rectangular) aperture section 49a in the center of a light shielding layer 49 and photodiodes 29 as four surrounding light receiving regions disposed adjacent to each of the top and bottom positions and the left and right positions of the photodiode 29a as light receiving regions in the center. The imaging device 18 is configured so that lights without directivity are received by the photodiode 29a as a light receiving region in the center and lights with respectively different directivity are separated and received by the photodiodes 29 as four surrounding light receiving regions. The photodiode 29a as a light receiving region in the center is configured to be larger in size in terms of area in comparison to each of the photodiodes 29 as a plurality of surrounding light receiving regions.

Figure 14:
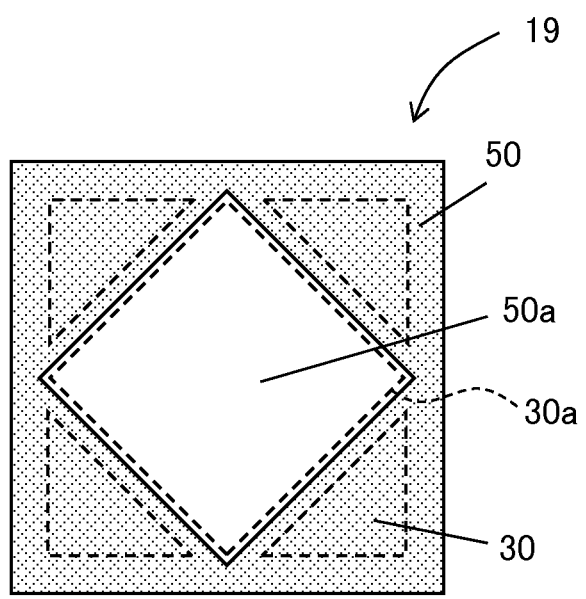
FIG. 14 is a plan-view showing another example of the relationship between the shape of an aperture section of a light shielding layer and the shape of a light receiving region therebelow of a pixel section of a solid-state imaging element in the imaging device of Embodiment 4 of the present invention.

FIG. 14 is a plan-view showing another example of the relationship between the shape of an aperture section of a light shielding plate and the shape of a light receiving region therebelow in an imaging device 19 of Embodiment 4 of the present invention.

As shown in FIG. 14, in the imaging device 19 of the present Embodiment 4, the outer shape of a light shielding layer 50 and the shape of an aperture section 50a in the center of the light shielding layer 50 are both quadrangular. Each corner section of a quadrangle of the aperture section 50a is disposed opposite of each side of the outer shape of the light shielding layer 50. A photodiode 30a as alight receiving region in the center is provided below (directly below) a position corresponding to the aperture section 50a in the center to receive lights without directivity. The four photodiodes 30 as four light receiving regions positioned around the light receiving region in the center separate and receive lights with respectively different directivity. The photodiode 30a as a light receiving region in the center is configured to be larger in area in comparison to each of the photodiodes 30 as a plurality of surrounding light receiving regions.

As described above, the imaging device 17, 18, or 19 of the present Embodiment 4 has a central photodiode 28, 29a, or 30a for receiving lights without directivity in the center section of a pixel and photodiodes 28, 29 or 30 for separating and receiving lights with different directivity surrounding the central photodiode. A plurality of photodiodes surrounding the central photodiode 28, 29a or 30a separate lights with different directivity. Thus, an aperture section of a light shielding layer is made small in the above-described Embodiment 3. However, there is a risk of decline in sensitivity thereby. In contrast, an aperture section of a light shielding layer is made large to make the area of a central photodiode therebelow large in the present Embodiment 4. Thus, light receiving sensitivity can be complemented with the central photodiode.

Furthermore, photodiodes are arranged in a 3×3 array pattern, a cross shape with a center and top, bottom, left, and right thereof or the like to enable receiving lights without directivity in the central photodiode while separating and receiving lights with respective directivity in a plurality of surrounding photodiodes. In this manner, a pixel having two features can be materialized to complement a decline in sensitivity due to a narrow aperture section.

Embodiment 5

Figure 15:
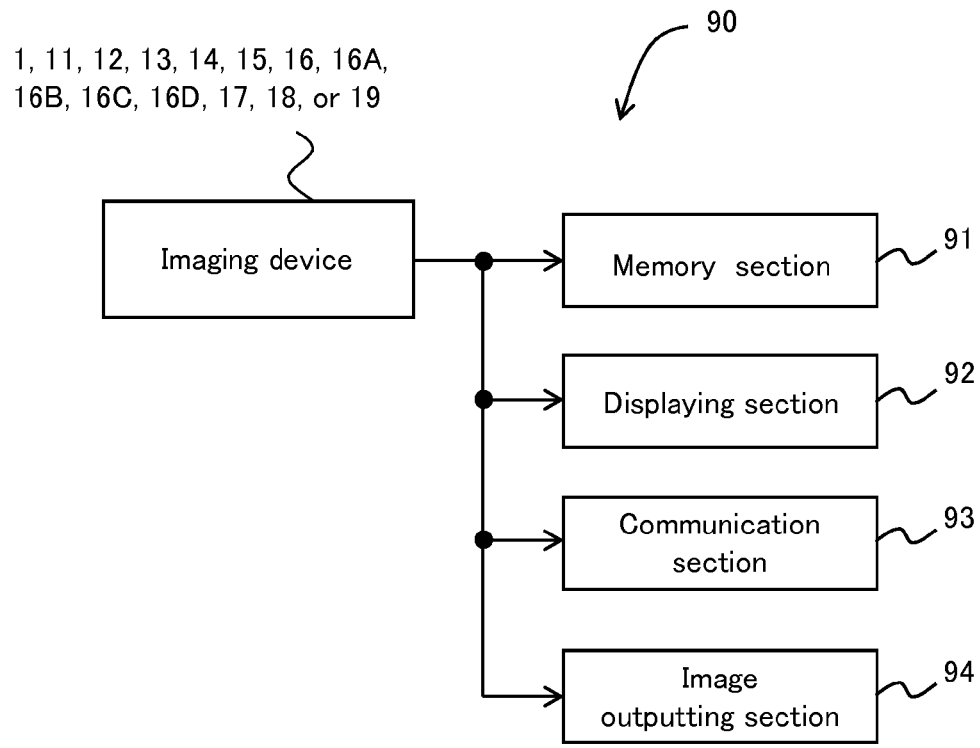
FIG. 15 is a block diagram showing an example of a schematic configuration of an electronic information instrument using an imaging device of any one of Embodiments 1-4 of the present invention in an imaging section as Embodiment 5 of the present invention.
Figure 16:
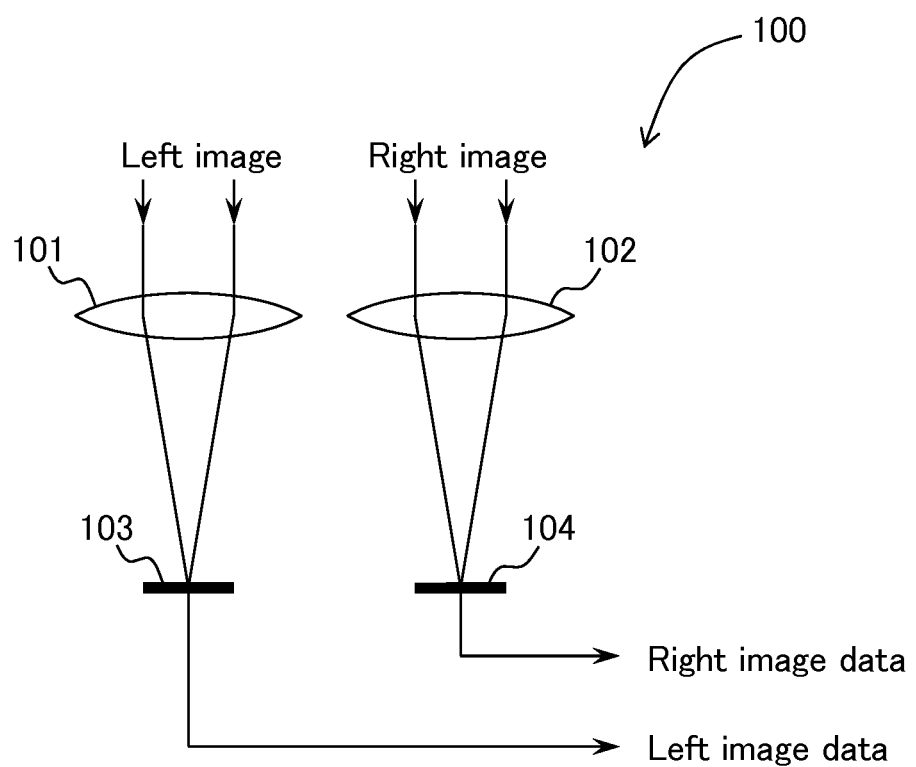
FIG. 16 is a schematic diagram showing an example of a configuration of essential parts of a conventional stereo imaging device.
Figure 17:
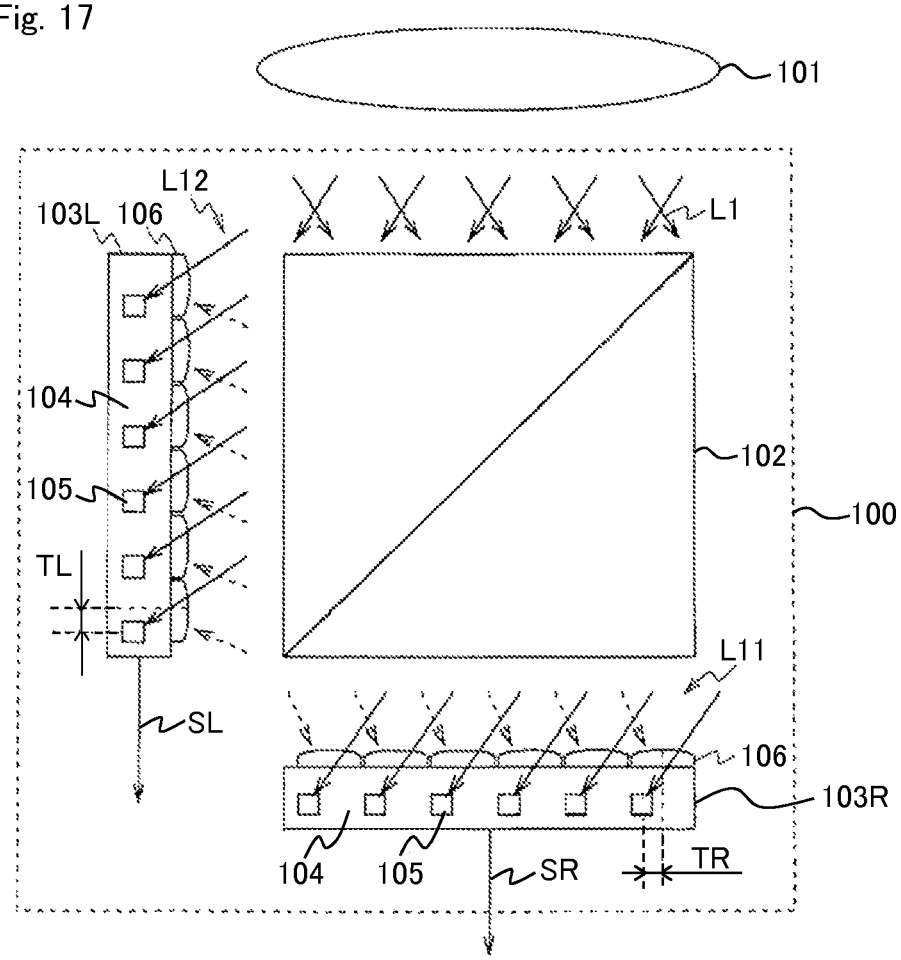
FIG. 17 is a cross-sectional view showing an example of a configuration of the conventional imaging section disclosed in Patent Literature 2 in detail.

FIG. 15 is a block diagram showing an example of a schematic configuration of an electronic information instrument using an imaging device of anyone of Embodiments 1-4 of the present invention in an imaging section as Embodiment 5 of the present invention.

In FIG. 15, electronic information instrument 90 of the present Embodiment 5 has: any one of imaging devices 1, 11-16, 16A-16D, and 17-19 of any one of the above-described Embodiments 1-4; a memory section 91 such as a recording medium that enables data recording after predetermined processing of a color three-dimensional signal from any one of said imaging devices for recording; a displaying section 92 such as a liquid crystal display device for enabling display on a display screen such as a liquid crystal display screen after predetermined processing of a color three-dimensional image signal from any one of said imaging devices for displaying; a communication section 93 such as a transceiver device that enables communication processing after predetermined processing of a color three-dimensional image signal from any one of said imaging devices for communicating; and an image outputting section 94 such as a printer that enables printing after predetermined printing processing of a color three-dimensional image signal from any one of said imaging devices for printing. The electronic information instrument 90 is not limited thereto. The instrument can have at least one of the memory section 91, displaying section 92, communication section 93, and image outputting section 94, such as a printer, in addition to one of the imaging devices.

As stated above, the electronic information instrument 90 includes, for example, electronic instrument having a digital camera such as a digital video camera or a digital still camera, a surveillance camera, a door camera, a car-mounted camera such as a car-mounted rear-view monitoring camera and an image input camera such as a video phone camera, a scanner device, a facsimile machine, a camera-equipped mobile phone device and a personal digital assistant (PDA), as well as an image input device or distance measuring device such as smartphone, compact digital camera, digital single-lens reflex camera, sensors of a self-propelling vacuum cleaner, and human detection sensor of an air conditioning unit.

Thus, according to the present Embodiment 5, it is possible to: three-dimensionally display a color three-dimensional image signal on a three-dimensional display screen properly; print out (print) a color three-dimensional image signal properly on a piece of paper by the image outputting section 94; communicate a color three-dimensional image signal properly through a wire or wirelessly as communication data; store a color three-dimensional image signal properly by performing predetermined data compression in the memory section 91; and perform a variety of data processing properly, based on the color three-dimensional image signal from any of said image devices.

In the present Embodiments 1-4, the reflection preventing film 6 is provided between the lens means 3 and the color filter 5. However, the configuration is not limited thereto. The reflection preventing film 6 can be provided between the lens means 3 and the light shielding layer 4.

As described above, the present invention is exemplified by the use of its preferred Embodiments 1 to 5 of the present invention. However, the present invention should not be interpreted solely based on Embodiments 1 to 5 described above. It is understood that the scope of the present invention should be interpreted solely based on the scope of the claims. It is also understood that those skilled in the art can implement equivalent scope of technology, based on the description of the present invention and common knowledge from the description of the detailed preferred Embodiments 1 to 5 of the present invention. Furthermore, it is understood that any patent, any patent application and any references cited in the present specification should be incorporated by reference in the present specification in the same manner as the contents are specifically described therein.

INDUSTRIAL APPLICABILITY

The present invention can be applied in the field of a stereoscopic imaging device comprising a stereo imaging device capable of imaging a plurality of images, such as stereoscopic stereo images, and electronic information instrument such as a digital camera such as a digital still camera or a digital video camera, image input camera, scanner, facsimile device, camera-equipped mobile phone device, as well as smartphones, compact digital cameras, digital single-lens reflex cameras, sensors of a self-propelling vacuum cleaner, and human detection sensors of an air conditioning unit using said imaging device in an imaging section as an image input device. It is possible to render a means for correcting tilts and positional deviations from a stereo image unnecessary, because each image light from a subject that has entered from different positions of a lens means is imaged as a plurality of images in a plurality of regions of a solid-state imaging element.

The invention claimed is:

1. An imaging device including a lens having a single focal point on an imaging surface, the imaging device comprising:
   a solid-state imaging element on which a plurality of pixels are arranged in a matrix pattern at the imaging surface; and
   a light shielding layer including a plurality of aperture sections, wherein
   one of the plurality of aperture sections corresponds to one pixel including a plurality of light receiving regions and separates incident image light from a subject into diagonal image light with different directivity,
   the plurality of aperture sections is provided in one-to-one correspondence with the plurality of pixels and in same positions relative to each of a corresponding pixel of the plurality pixels,
   in a plan view of the solid-state imaging element, all of the plurality of light receiving regions of one pixel are disposed in areas where the aperture section corresponding to the one pixel does not exist, and none of the plurality of light receiving regions of the one pixel are disposed in an area where the aperture section corresponding to the one pixel exists,
   the plurality of light receiving regions include a plurality of photodiodes, and
   the plurality of photodiodes receive the diagonal image light with different directivity and photoelectrically convert the received diagonal image light such that the incident image light from the subject is simultaneously imaged in the plurality of photodiodes as a plurality of images.

2. The imaging device of claim 1, wherein the incident light is received by the solid-state imaging element as a right image that has entered a right side of the lens and a left image that has entered a left side of the lens for stereo imaging.

3. The imaging device of claim 1, wherein a light shielding member is in a belt shape at a center section of the lens in a longitudinal direction in a plan-view, and the lens is divided into a right-side region and a left-side region by the light shielding member.

4. The imaging device of claim 1, wherein a light shielding member is in an upper edge region and a bottom edge region of the lens in a plan-view, and a light passing region of the lens is a transverse central region that is narrowed from top and bottom edges.

5. The imaging device of claim 1, further comprising a color filter with a predetermined color arrangement for each of the pixels above the light shielding layer in the pixels in the solid-state imaging device.

6. The imaging device of claim 1, further comprising a reflection preventing film above the light shielding layer or a color filter in the pixels in the solid-state imaging element.

7. The imaging device of claim 1, wherein the plurality of light receiving regions for each of the pixels in the solid-state imaging element includes two left and right or top and bottom imaging regions for receiving the diagonal image light that has passed an aperture section of the plurality of aperture sections in a longitudinal or transverse direction.

8. The imaging device of claim 7, wherein the aperture section of the plurality of aperture sections in the longitudinal or transverse direction for each of the pixels in the solid-state imaging element includes a slit-shaped or rectangular-shaped aperture section that is long in the longitudinal or transverse direction, and two left and right or top and bottom imaging regions in a direction with directivity in the longitudinal or transverse direction through the slit-shaped or rectangular-shaped aperture section.

9. The imagining device of claim 1, wherein the solid-state imaging device includes a plurality of light receiving regions around the plurality of aperture sections of the light shielding layer in a plan-view for each of the pixels.

10. The imaging device of claim 9, wherein a shape of each of the plurality of aperture sections of the light shielding layer is a cross shape in a plan-view, and the solid-state imaging element includes four light receiving regions in four quadrangles, whose sides are ½ of each of longitudinal and transverse sides for each of the pixels, wherein the cross shape divides the light receiving regions in four.

11. The imaging device of claim 9, wherein
a shape of each of the plurality of aperture sections of the light shielding layer includes a quadrangular shape in a center in a plan-view,
the solid-state imaging element includes four light receiving regions in four quadrangles that are adjacent to each corner section defined by two adjacent longitudinal and transverse sides of the quadrangular shape in the center for each of the pixels,
the two adjacent sides are parallel to the sides of the four light receiving regions.

12. The imaging device of claim 9, wherein
a shape of each of the plurality of aperture sections of the light shielding layer is polygonal in a center in a plan-view, and
the solid-state imaging element includes trapezoidal light receiving regions in a same number as a number of all sides of the plurality of aperture sections for each of the pixels, such that top sides are parallel and adjacent to all sides of the plurality of aperture sections and an area expands farther away from the central polygonal shape.

13. The imaging device of claim 9, wherein
a shape of each of the plurality of aperture sections of the light shielding layer are circular in a center in a plan-view, and
the solid-state imaging element includes the plurality of light receiving regions in a plurality of fan shapes for each of the pixels, such that a width expands further away from the circular shape around the circular shape of the center.

14. The imaging device of claim 9, wherein
the plurality of light receiving regions for each of the pixels are on the left and right in a plan-view, and
the plurality of light receiving regions have a stereo image structure in which a light receiving region for a right image with directivity in a right diagonal direction and a light receiving region for a left image with directivity in a left diagonal direction are a pair.

15. The imaging device of claim 9, wherein the plurality of light receiving regions of each of the pixels include four light receiving regions in a 2×2 array shape, wherein the plurality of light receiving regions separate and receive light with different directivity.

16. The imaging device of claim 9, wherein the plurality of light receiving regions for each of the pixels are divided in a cross shape or an X shape and include four light receiving regions that are in top and bottom directions and left and right directions or diagonal directions from top right to bottom left and from top left to bottom right,
the plurality of light receiving regions separate and receive light with different directivity.

17. The imaging device of claim 9, wherein the plurality of light receiving regions include each of the light receiving regions that are separated radially into a plurality of light receiving regions from the plurality of aperture sections of the light shielding layer in a center section in a plan-view,
the plurality of light receiving regions separate and receive light with different directivity.

18. The imaging device of claim 9, wherein a single central light receiving region is further provided below a position corresponding to the plurality of aperture sections in a center of the light shielding layer for each of the pixels.

19. The imaging device of claim 9, wherein a single central light receiving region is further provided at a position below the aperture section of the light shielding layer, wherein the single light receiving region receives a light without directivity from the aperture section.

20. An electronic information device including the imaging device of claim 1 in an imaging section as an image input device.

* * * * *